United States Patent
Zou, Sr. et al.

(10) Patent No.: US 12,169,356 B2
(45) Date of Patent: Dec. 17, 2024

(54) MASK PLATE

(71) Applicants: Beijing BOE Display Technology Co., Ltd., Beijing (CN); BOE TECHNOLOGY GROUP CO., LTD., Beijing (CN)

(72) Inventors: Jiabin Zou, Sr., Beijing (CN); Xiaofeng Yin, Beijing (CN); Chunguang Tian, Beijing (CN); Na Wen, Beijing (CN)

(73) Assignees: Beijing BOE Display Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 362 days.

(21) Appl. No.: 17/639,071

(22) PCT Filed: Apr. 9, 2021

(86) PCT No.: PCT/CN2021/086282
§ 371 (c)(1),
(2) Date: Feb. 28, 2022

(87) PCT Pub. No.: WO2021/223569
PCT Pub. Date: Nov. 11, 2021

(65) Prior Publication Data
US 2022/0326599 A1    Oct. 13, 2022

(30) Foreign Application Priority Data

May 8, 2020 (CN) .................. 202010383667.X

(51) Int. Cl.
*G03F 1/38* (2012.01)
*G02F 1/1335* (2006.01)
*G02F 1/1362* (2006.01)

(52) U.S. Cl.
CPC .......... *G03F 1/38* (2013.01); *G02F 1/133512* (2013.01); *G02F 1/13625* (2021.01)

(58) Field of Classification Search
None
See application file for complete search history.

(56) References Cited

U.S. PATENT DOCUMENTS

| | | |
|---|---|---|
| 9,423,687 B2 | 8/2016 | Liao et al. |
| 2014/0057082 A1* | 2/2014 | Liao .................. G03F 7/00 428/167 |
| 2020/0103750 A1 | 4/2020 | Zheng et al. |

FOREIGN PATENT DOCUMENTS

| | | |
|---|---|---|
| AU | 2003292695 A1 | 8/2004 |
| CN | 102819183 A | 12/2012 |

(Continued)

OTHER PUBLICATIONS

International Search Report and Written Opinion for International Application No. PCT/CN2021/086282 mailed Jun. 30, 2021.

(Continued)

*Primary Examiner* — Shan Liu
(74) *Attorney, Agent, or Firm* — Perilla Knox & Hildebrandt LLP; Kenneth A. Knox

(57) ABSTRACT

A mask is provided that includes a first graphic region and a second graphic region disposed along a first direction. The first graphic region comprises a first splicing exposure region. The second graphic region comprises a second splicing exposure region. The first splicing exposure region is used for, after being translated along a first vector, forming a first splicing auxiliary region, and the first splicing auxiliary region coincides with the second splicing exposure region.

12 Claims, 8 Drawing Sheets

(56) References Cited

FOREIGN PATENT DOCUMENTS

| CN | 108761995 | A | | 11/2018 | | |
|---|---|---|---|---|---|---|
| CN | 110058486 | A | * | 7/2019 | ............... | G03F 1/44 |
| CN | 110333642 | A | | 10/2019 | | |
| CN | 111025842 | A | * | 4/2020 | ............... | G03F 1/38 |
| CN | 111443566 | A | | 7/2020 | | |
| JP | 2004071767 | A | | 3/2004 | | |
| WO | 2004064126 | A1 | | 7/2004 | | |
| WO | WO-2020192010 | A1 | * | 10/2020 | | |

OTHER PUBLICATIONS

First Office Action for CN Patent Application No. 202010383667.X mailed Sep. 3, 2021.
Second Office Action for CN Patent Application No. 202010383667.X mailed Sep. 3, 2021.

* cited by examiner

MASK PLATE

CROSS-REFERENCE TO RELATED APPLICATIONS

This application is a national phase application under 35 U.S.C. § 371 of International Application No. PCT/CN2021/086282, filed Apr. 9, 2021, which claims the benefit of and priority Chinese Patent Application No. 202010383667.X entitled "MASK PLATE," filed May 8, 2020, the contents of both of which being incorporated by reference in their entireties herein.

TECHNICAL FIELD

The present disclosure relates to the field of display technology and, more particularly, to a mask plate.

BACKGROUND

When a large-size display panel is prepared, a patterning operation of one file often requires a splicing exposure process. However, when a conductive lead is prepared through the splicing exposure process, it is difficult to efficiently control the width of the conductive lead in a repeated exposure region, which reduces the uniformity of the display panel.

The above-mentioned information disclosed in the background section is merely used to enhance the understanding of the background of the present disclosure, and therefore it can include information which does not constitute prior art known to those skilled in the art.

SUMMARY

The present disclosure is directed to provide a mask to improve the uniformity of the display panel.

In order to achieve the foregoing objective of the disclosure, the following technical solutions are proposed by the present disclosure.

According to one aspect of the present disclosure, there is provided a mask including a first graphic region and a second graphic region disposed along a first direction; the first graphic region includes a first splicing exposure region; the second graphic region includes a second splicing exposure region; the first splicing exposure region is used for, after being translated along a first vector, forming a first splicing auxiliary region, and the first splicing auxiliary region coincides with the second splicing exposure region;

the mask includes a plurality of light-shielding strips arranged along a second direction, the second direction being perpendicular to the first direction; any one of the light-shielding strips includes a first splicing light-shielding strip and a second splicing light-shielding strip correspondingly disposed; the first splicing light-shielding strip is provided in the first splicing exposure region, and penetrates the first splicing exposure region in the first direction; and the second splicing light-shielding strip is provided in the second splicing exposure region, and penetrates the second splicing exposure region in the first direction; and a width of one of the first splicing light-shielding strip and corresponding second splicing light-shielding strip is equal to a target width, a width of the other one is equal to a first auxiliary width, and the first auxiliary width is greater than the target width; a pattern of the first splicing light-shielding strip is used for, after being translated along the first vector, forming a first auxiliary splicing pattern; and the first auxiliary splicing pattern is located within the corresponding second splicing light-shielding strip, or the first auxiliary splicing pattern covers the corresponding second splicing light-shielding strip.

In some exemplary embodiments of the present disclosure, the first auxiliary width is equal to 1.2 to 2 times the target width.

In some exemplary embodiments of the present disclosure, the first graphic region further includes a first independent exposure region, the first independent exposure region being disposed adjacent to the first splicing exposure region along the first direction; the second graphic region further includes a second independent exposure region, the second independent exposure region being disposed adjacent to the second splicing exposure region along the first direction; and the first independent exposure region is used for, after being translated along the first vector, forming a first independent auxiliary region, and the first independent auxiliary region and the second independent exposure region are located on both sides of the second splicing exposure region, respectively;

any one of the light-shielding strips further includes a first independent light-shielding strip disposed corresponding to the first splicing light-shielding strip and a second independent light-shielding strip disposed corresponding to the second splicing light-shielding strip; the first independent light-shielding strip is provided in the first independent exposure region and connected with corresponding first splicing light-shielding strip, and penetrates the first independent exposure region in the first direction; and the second independent light-shielding strip is provided in the second independent exposure region and connected with corresponding second splicing light-shielding strip, and penetrates the second independent exposure region in the first direction; and widths of the first independent light-shielding strip and the second independent light-shielding strip are both equal to the target width.

In some exemplary embodiments of the present disclosure, the mask further includes a third graphic region, the third graphic region including a third independent exposure region and a third splicing exposure region adjacently disposed along the first direction; the first graphic region further includes a fourth splicing exposure region, and the fourth splicing exposure region and the first splicing exposure region are disposed on both sides of the first independent exposure region, respectively; the fourth splicing exposure region is used for, after being translated along a second vector, forming a second splicing auxiliary region, and the second splicing auxiliary region coincides with the third splicing exposure region; and the first independent exposure region is used for, after being translated along the second vector, forming a second independent auxiliary region, and the second independent auxiliary region and the third independent exposure region are located on both sides of the third splicing exposure region, respectively;

the light-shielding strips further include a third splicing light-shielding strip disposed corresponding to the first splicing light-shielding strip, a fourth splicing light-shielding strip disposed corresponding to the second splicing light-shielding strip, and a third independent light-shielding strip disposed corresponding to the first independent light-shielding strip and the second independent light-shielding strip; the third independent light-shielding strip is provided in the third independent exposure region, and penetrates the third independent exposure region in the first direction, and a width of the third independent light-shielding strip is equal to the target width; the third splicing light-shielding strip is provided in the third splicing exposure region and connected with corresponding third independent light-shielding strip, and penetrates the third splicing exposure region in the first direction; and the fourth splicing light-shielding strip is provided in the fourth splicing exposure region and connected with corresponding first independent light-shielding strip, and penetrates the fourth splicing exposure region in the first direction; and a width of one of the fourth splicing light-shielding strip and corresponding third splicing light-shielding strip is equal to the target width, a width of the other one is equal to a second auxiliary width, and the second auxiliary width is greater than the target width; a pattern of the fourth splicing light-shielding strip is used for, after being translated along the second vector, forming a second auxiliary splicing pattern; and the second auxiliary splicing pattern is located within corresponding third splicing light-shielding strip, or the second auxiliary splicing pattern covers the corresponding third splicing light-shielding strip.

In some exemplary embodiments of the present disclosure, the second auxiliary width is equal to 1.2 to 2 times the target width.

In some exemplary embodiments of the present disclosure, the fourth splicing exposure region is used for, after being translated along a third vector, forming a third splicing auxiliary region, and the third splicing auxiliary region coincides with the first splicing exposure region; and a width of one of the first splicing light-shielding strip and corresponding fourth splicing light-shielding strip is equal to the target width; the fourth splicing light-shielding strip is used for, after being translated along the third vector, forming a third auxiliary splicing pattern; and the third auxiliary splicing pattern is located within corresponding first splicing light-shielding strip, or the third auxiliary splicing pattern covers the corresponding first splicing light-shielding strip.

In some exemplary embodiments of the present disclosure, the fourth splicing exposure region is used for, after being translated along a third vector, forming a third splicing auxiliary region, and the third splicing auxiliary region coincides with the first splicing exposure region; and a pattern of the fourth splicing light-shielding strip, is used for, after being translated along the third vector, forming a third auxiliary splicing pattern; the first splicing light-shielding strip is provided with at least a sacrificial light-shielding segment along an extending direction of the first splicing light-shielding strip, and the sacrificial light-shielding segment is completely non-overlapped with the third auxiliary splicing pattern.

In some exemplary embodiments of the present disclosure, a plurality of light-shielding strip groups are formed by the plurality of the light-shielding strips, and any one of the light-shielding strip groups includes a previous light-shielding strip and a latter light-shielding strip adjacently disposed; and in one of the light-shielding strip groups, one end of the first independent light-shielding strip of the previous light-shielding strip close to the first splicing exposure region is bent towards a direction away from the latter light-shielding strip, one end of the second independent light-shielding strip of the previous light-shielding strip close to the second splicing exposure region is bent towards the direction away from the latter light-shielding strip, one end of the first independent light-shielding strip of the latter light-shielding strip close to the fourth splicing exposure region is bent towards a direction away from the previous light-shielding strip, and one end of the third independent light-shielding strip of the latter light-shielding strip close to the third splicing exposure region is bent towards the direction away from the previous light-shielding strip.

In some exemplary embodiments of the present disclosure, a plurality of light-shielding strip groups are formed by the plurality of the light-shielding strips, any one of the light-shielding strip groups includes a previous light-shielding strip and a latter light-shielding strip adjacently disposed; and in any one of the light-shielding strip groups:

one end of the second independent light-shielding strip of the previous light-shielding strip close to the second splicing exposure region is bent towards a direction away from the latter light-shielding strip, one end of the third independent light-shielding strip of the previous light-shielding strip close to the third splicing exposure region is bent towards the direction away from the latter light-shielding strip, one end of the second independent light-shielding strip of the latter light-shielding strip close to the second splicing exposure region is bent towards a direction away from the previous light-shielding strip, and one end of the third independent light-shielding strip of the latter light-shielding strip close to the third splicing exposure region is bent towards the direction away from the previous light-shielding strip;

along a direction away from the first independent exposure region, the first splicing light-shielding strip of the previous light-shielding strip extends towards the direction away from the latter light-shielding strip, the first splicing light-shielding strip of the latter light-shielding strip extends towards the direction away from the previous light-shielding strip, the fourth splicing light-shielding strip of the previous light-shielding strip extends towards the direction away from the latter light-shielding strip, and the fourth splicing light-shielding strip of the latter light-shielding strip extends towards the direction away from the previous light-shielding strip;

along a direction away from the second independent exposure region, the second splicing light-shielding strip of the previous light-shielding strip extends towards a direction close to the latter light-shielding strip, and the second splicing light-shielding strip of the latter light-shielding strip extends towards a direction close to the previous light-shielding strip; and along a direction away from the third independent exposure region, the third splicing light-shielding strip of the previous light-shielding strip extends towards the direction close to the latter light-shielding strip, and the third splicing light-shielding strip of the latter light-shielding strip extends towards the direction close to the previous light-shielding strip.

In some exemplary embodiments of the present disclosure, a size of the first splicing exposure region along the first direction is equal to 1.5 to 8 times the target width.

BRIEF DESCRIPTION OF THE DRAWINGS

The foregoing and other features and advantages of the present disclosure will become more apparent through describing the exemplary embodiments thereof in detail with reference to the accompanying drawings.

DETAILED DESCRIPTION

Figure 1:
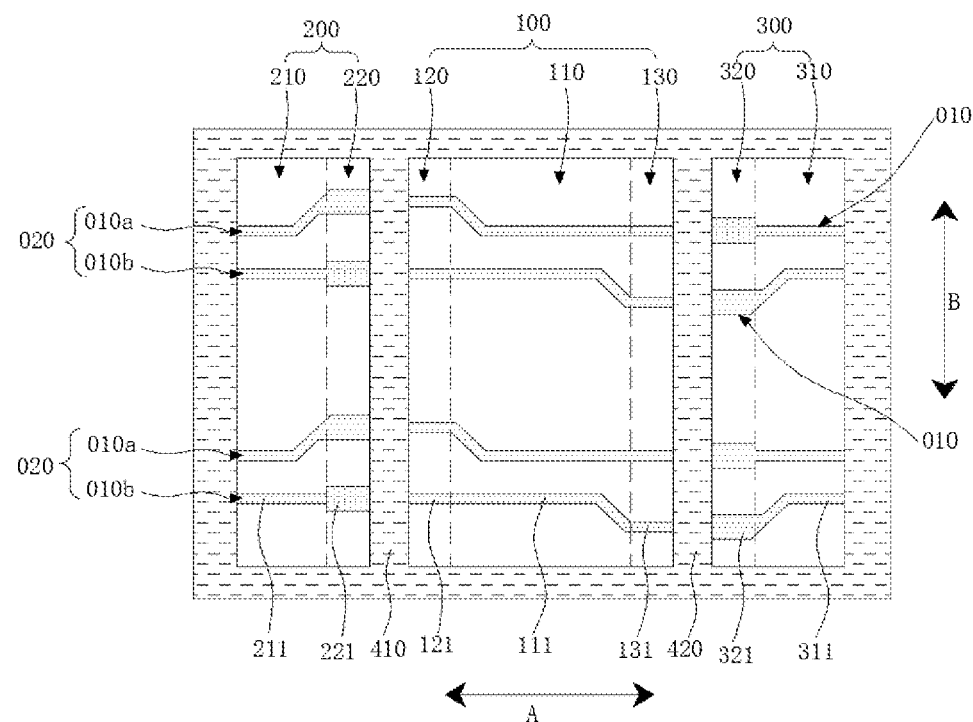
FIG. 1 is a schematic diagram of a mask according to some embodiments of the present disclosure.

Exemplary embodiments will now be described more fully with reference to the accompanying drawings. However, the exemplary embodiments can be implemented in various forms, and should not be understood as being limited to the examples set forth here; and on the contrary, these embodiments are provided so that the present disclosure will be more comprehensive and complete, and the conception of the exemplary embodiments will be fully conveyed to those skilled in the art. The described features, structures and characteristics may be combined in one or more embodiments in any suitable manner. In the following description, many specific details are provided, thereby giving a sufficient understanding of the embodiments of the present disclosure.

In the drawings, the thickness of a region or a layer may be exaggerated for clarity. Same reference numbers in the drawings represent same or similar structures, and thus their detailed description will be omitted.

The described features, structures or characteristics may be combined in one or more embodiments in any suitable manner. In the following description, many specific details are provided, thereby giving a sufficient understanding of the embodiments of the present disclosure. However, those skilled in the art will realize that the technical solutions of the present disclosure can be practiced without one or more of the specific details, or other methods, components, materials, and the like can be used. In other conditions, a well-known structure, material, or operation is not shown or described in detail to avoid obscuring the main technical ideas of the present disclosure.

The terms "a", "an" and "the" are used to indicate the presence of one or more elements/components and the like; and the terms "include" and "comprise" are used to mean non-exclusive inclusion, and indicate that there may be additional element/component and the like in addition to the listed element/component and the like. The terms "first", "second" and the like are merely used as markers, and are not intended to limit the number of objects thereof.

The first direction and the second direction in the present disclosure may refer to bilateral directions rather than unilateral directions, and may be, for example, left-right directions, up-down directions, front-back directions, and the like. In the present disclosure, when the width of one structure or region is described, the size of the structure or region perpendicular to its extending direction is referred to.

In the related art, a conductive lead can be prepared by means of a splicing exposure process. During the splicing exposure, exposures are respectively performed on the backplate using two masks, and in the two exposures, there is an overlapping repeat exposure region to ensure the continuity of the conductive leads eventually formed in the two exposures. In the repeat exposure region, the patterns of the two masks are completely the same, so that the width of the conductive lead formed is equal to the width of the pattern of the mask in the repeat exposure region. However, when alignment offset occurs in the mask, the width of the conductive lead in the repeat exposure region will deviate from the set width, which may cause different conductive characteristics of different conductive leads, the uniformity of the display panel is reduced, and especially, the uniformity between different display panels are reduced.

The present disclosure provides a mask for patterning a conductive material layer of the backplane through the splicing exposure process to form the conductive lead of required width.

Figure 2:
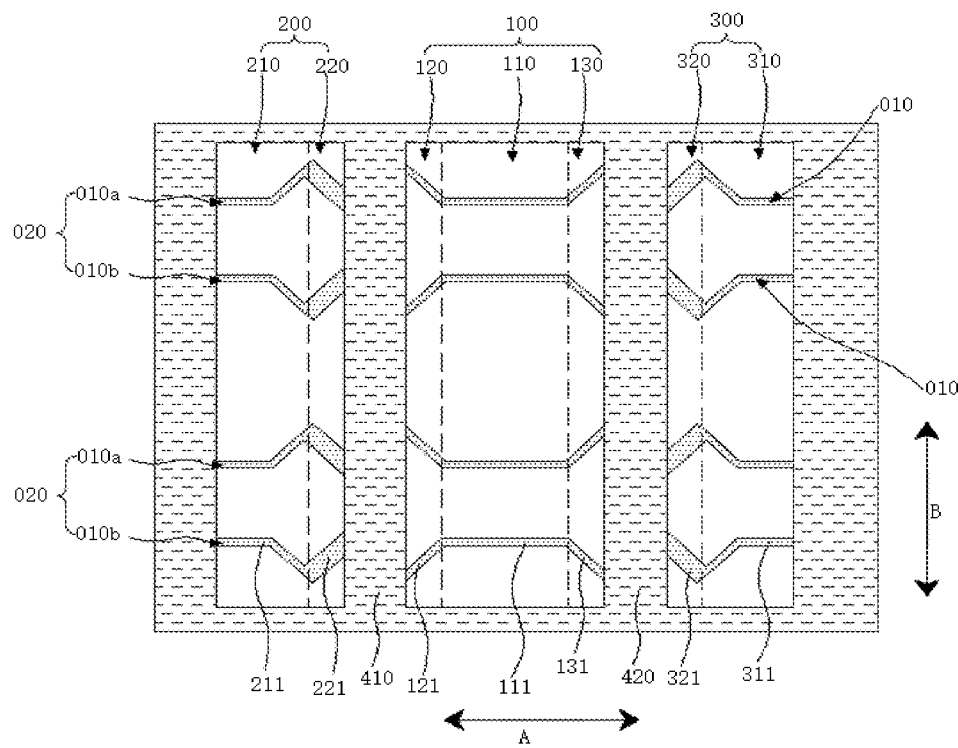
FIG. 2 is a schematic diagram of a mask according to some embodiments of the present disclosure.
Figure 3:
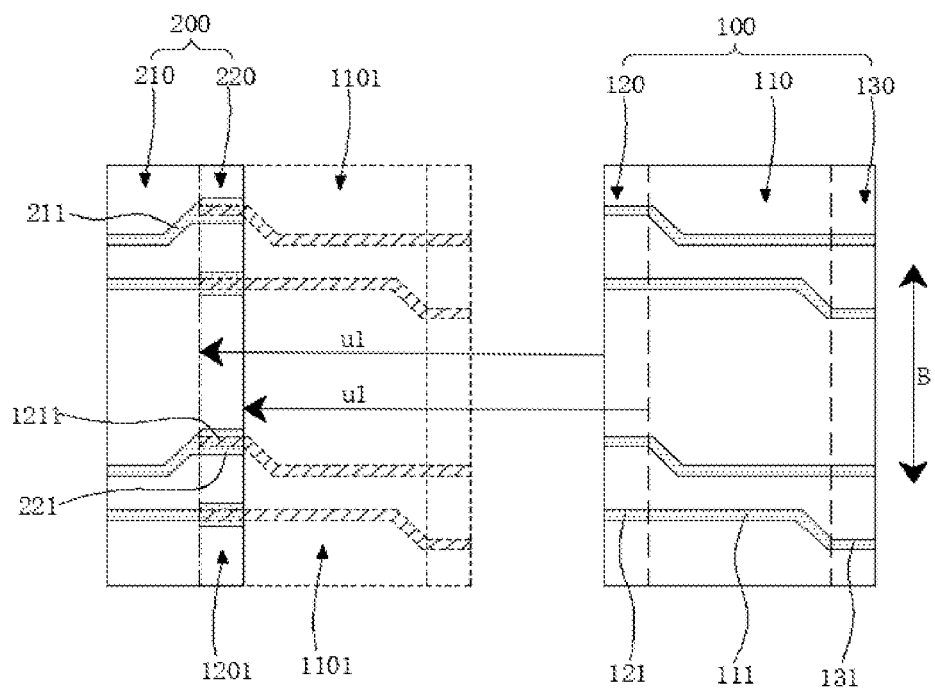
FIG. 3 is a schematic diagram of translating a pattern of a first graphic region along a first vector in a mask according to some embodiments of the present disclosure.

As shown in FIGS. 1 and 2, the mask provided by the present disclosure includes a first graphic region 100 and a second graphic region 200 disposed along a first direction A; the first graphic region 100 includes a first splicing exposure region 120; the second graphic region 200 includes a second splicing exposure region 220. As shown in FIG. 3, after translation along a first vector u1, the first splicing exposure region 120 can be formed into a first splicing auxiliary region 1201, and the first splicing auxiliary region 1201 coincides with the second splicing exposure region 220.

As shown in FIGS. 1 and 2, the mask provided by the present disclosure includes a plurality of light-shielding strips 010 arranged along a second direction B, and the second direction B is perpendicular to the first direction A. Any one of the light-shielding strips 010 includes a first splicing light-shielding strip 121 and a second splicing light-shielding strip 221 correspondingly disposed; the first splicing light-shielding strip 121 is provided in the first splicing exposure region 120, and penetrates the first splicing exposure region 120 in the first direction A; and the second splicing light-shielding strip 221 is provided in the second splicing exposure region 220, and penetrates the second splicing exposure region 220 in the first direction A.

Of the first splicing light-shielding strip 121 and the corresponding second splicing light-shielding strip 221, the width of one is equal to a target width, the width of the other is equal to a first auxiliary width, and the first auxiliary width is greater that the target width. As shown in FIG. 3 (the situation that the width of the first splicing light-shielding strip 121 is equal to the first auxiliary width is not shown), after translation along the first vector u1, the pattern of the first splicing light-shielding strip 121 can be formed into a first auxiliary splicing pattern 1211; and the first auxiliary splicing pattern 1211 is located within the corresponding second splicing light-shielding strip 221, or the first auxiliary splicing pattern 1211 covers the corresponding second splicing light-shielding strip 221.

When a display panel is prepared, it is possible that firstly, a conductive material layer is formed on a surface of a backplate 500, and a positive photoresist layer is formed on a surface of the conductive material layer away from the backplate; and then, the splicing exposure is perform using the mask provided by the present disclosure. During the splicing exposure, the exposure operations can be respectively performed on the positive photoresist layer using the first graphic region 100 and the second graphic region 200, respectively, and during the exposure operation, the first splicing exposure region 120 and the second splicing exposure region 220 are used to repeatedly expose the same repeat exposure region of the positive photoresist layer. In this way, during the exposure, the first splicing light-shielding strip 121 and its corresponding second splicing light-shielding strip 221 shield the light, respectively, at the same position, so that the width of the positive photoresist region eventually unexposed at this position is equal to the target width. Since the width of one of the first splicing light-shielding strip 121 and the corresponding second splicing light-shielding strip 221 is greater than the target width, even if alignment offset occurs in one of the exposure operations, the width of the positive photoresist region unexposed in the repeat exposure region can be avoided from being changed. After the exposure is completed, development can be performed, and a positive photoresist pattern with the target width can be formed in the repeat exposure region; and then, the exposed conductive material layer is etched and the positive photoresist is removed, and a conductive lead with the width as required can be obtained in the repeat exposure region. Therefore, based on the splicing exposure process performed using the mask provided by the present disclosure, even if situations such as alignment offset and the like occur in the exposure operation, the width of the conductive lead in the repeat exposure region may not be affected, thereby improving the uniformity of different conductive leads and the uniformity of different display panels.

Hereinafter, the mask of the present disclosure will be further illustrated with reference to the accompanying drawings to further explain the structure, principle, and effect of the mask of the present disclosure.

The mask provided by the present disclosure is used for performing a patterning operation for the conductive material layer formed on one side of the backplate through the splicing exposure to form a conductive structure layer. The conductive structure layer can be an active layer, a gate layer, a source/drain metal layer, a pixel electrode layer, a common electrode layer, a touch electrode layer, a touch lead layer, or other film with a conductive structure, of the display panel. The formed conductive structure can include various functional structures formed by patterning the conductive material layer, which include, but are not limited to, the conductive leads. For example, in some embodiments of the present disclosure, the conductive structure layer is the source/drain metal layer, and the conductive structure layer may include a source drain switching electrode, a data line as the conductive lead, and the like. For example, in some other embodiments of the present disclosure, the conductive structure layer is the gate layer, and the conductive structure layer may include a plate electrode of storage capacitance, a scan line as the conductive lead, and the like. In the conductive lead as prepared, the width thereof may be determined based on process requirements of the display panel. For example, the width of the conductive lead may be 5 to 12 microns.

The mask of the present disclosure are especially suitable for preparing a large-size display panel, for example, for preparing display panels with 100 inches, 110 inches, or other size. The prepared display panel may be a high-resolution display panel, and may be, for example, a high-definition display panel, an ultra high-definition display panel, a 2K display panel, a 4K display panel, an 8K display panel or a display panel with higher resolution, which is not limited in the present disclosure. The prepared display panel may be a liquid crystal display panel, an OLED display panel, a Micro LED display panel, or a display panel of other type, which is not limited in the present disclosure.

Figure 6:
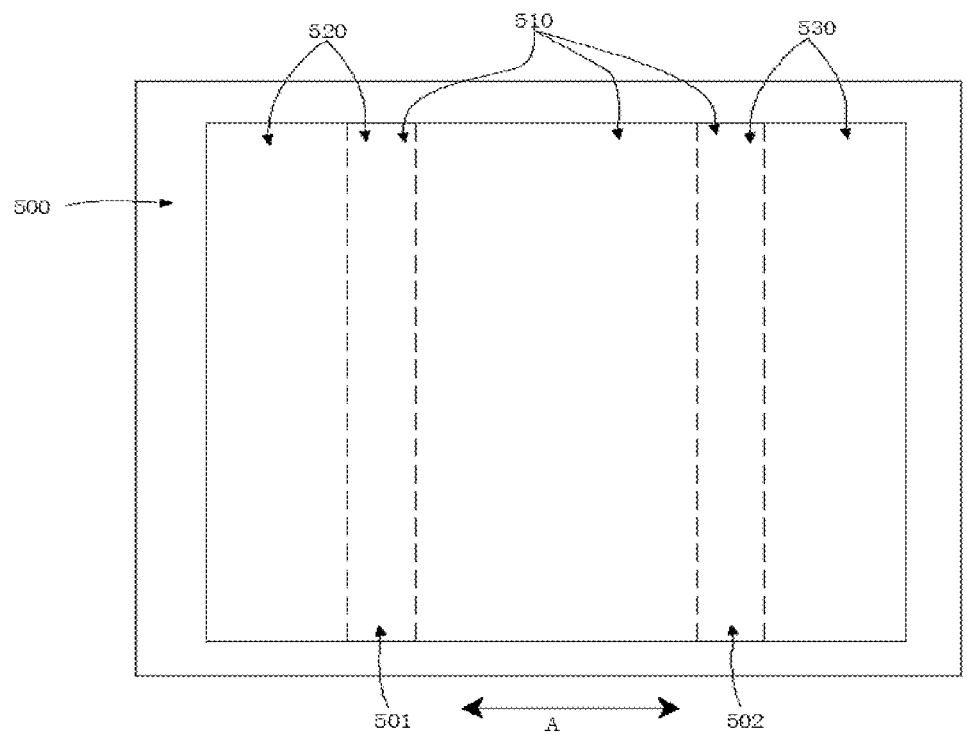
FIG. 6 is a schematic diagram of a backplate according to some embodiments of the present disclosure.

As shown in FIG. 6, the backplate 500 may include a first patterned region 510 and a second patterned region 520 arranged along the first direction A, the first patterned region 510 and the second patterned region 520 partially coincides, and the region where the both coincide is a first repeat exposure region 501. During the exposure operation, the first graphic region 100 of the mask may be used to be aligned with the first patterned region 510 of the backplate 500 for exposure, so that the second graphic region 200 of the mask is aligned with the second patterned region 520 of the backplate 500 for exposure, and the first splicing exposure region 120 of the mask and the second splicing exposure region 220 of the mask are both aligned with the first repeat exposure region 501 of the backplate 500 in the two exposure operations.

Through optimizing the mask or optimizing the exposure process, mutual interference between different pattern regions of the mask can be avoided during exposure. For example, in some embodiments of the present disclosure, when a pattern region of the mask is aligned with a patterned region of the backplate 500 for exposure, the other positions of the mask, especially other patter regions of the mask, can be shielded using a light-shield plate. Exemplarily, when the first graphic region 100 of the mask is aligned with the first patterned region 510 of the backplate 500 for exposure, other positions of the mask can be shielded using the light-shielding plate. Taking another example, in some other embodiments of the present disclosure, the mask may be provided with a light-shielding band between two adjacent pattern regions to avoid mutual interference between the two pattern regions during the exposure operation. Exemplarily, as shown in FIGS. 1 and 2, the mask is provided with a first light-shielding band 410 between the first graphic region 100 and the second graphic region 200.

During the exposure operation employing the first graphic region 100 and the second graphic region 200, respectively, the exposure operations may be respectively performed sequentially employing the first graphic region 100 and the second graphic region 200, and the exposure operations may also be respectively performed sequentially employing the second graphic region 200 and the first graphic region 100, which is not limited in the present disclosure.

Figure 7:
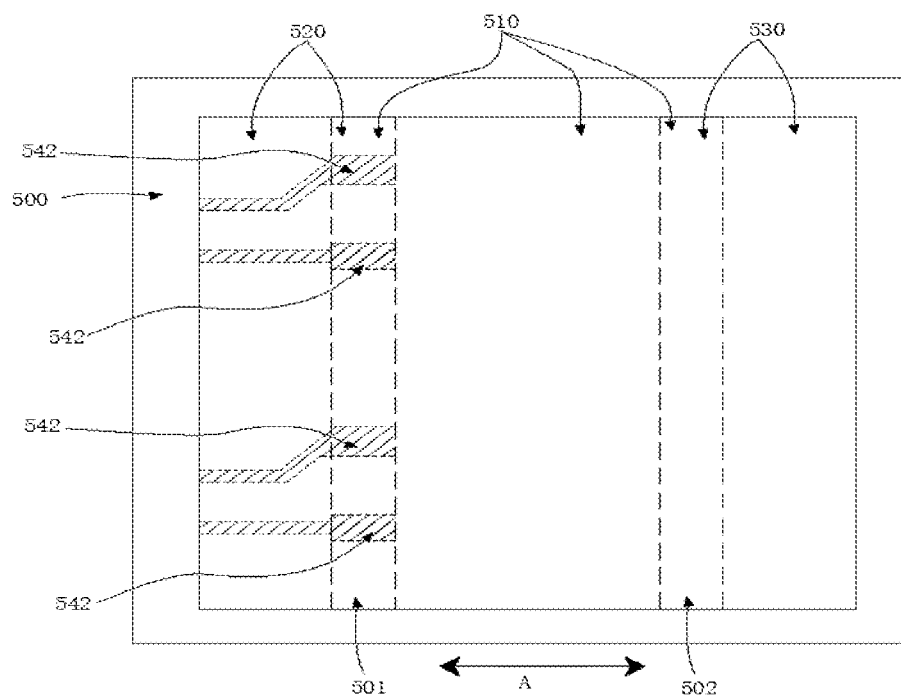
FIG. 7 is a schematic diagram of regions shielded by light-shielding strips when a second patterned region is exposed in some embodiments of the present disclosure.
Figure 8:
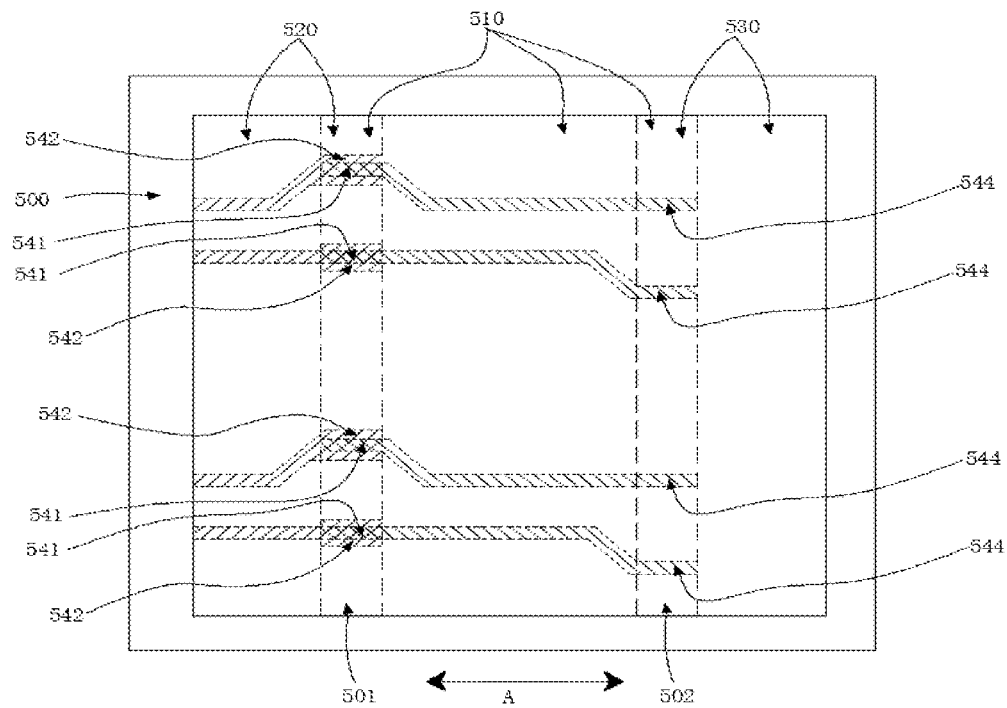
FIG. 8 is a schematic diagram of regions shielded by light-shielding strips when a first patterned region is exposed in some embodiments of the present disclosure.
Figure 10:
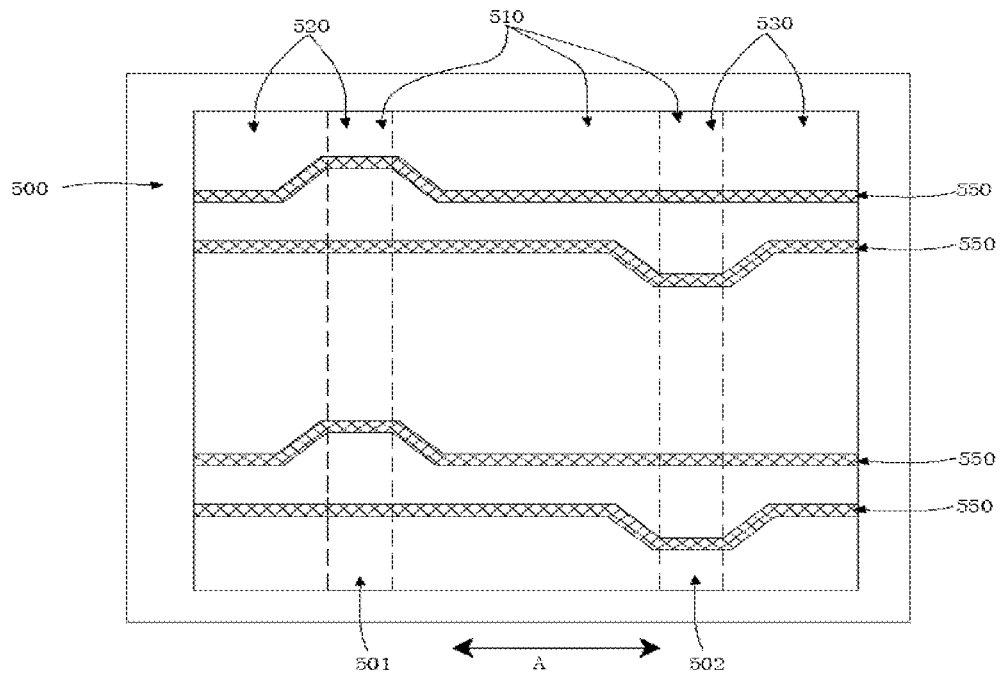
FIG. 10 is a schematic diagram of conductive leads in some embodiments of the present disclosure.

In some embodiments of the present disclosure, after the conductive material layer and the positive photoresist layer are sequentially formed on the surface of the backplate 500, as shown in FIGS. 7 and 8, the second graphic region 200 of the mask is aligned with the second patterned region 520 of the backplate 500 for exposure, and then, the first graphic region 100 of the mask is aligned with the first patterned region 510 of the backplate 500 for exposure. After the exposure operation, a development operation can be performed to form a patterned positive photoresist layer, where the positive photoresist unexposed is remained, and the positive photoresist exposed is removed. The patterned positive photoresist layer exposes part of the conductive material layer, a patterning operation is performed on the conductive material layer through an etching process, a part of the conductive material layer covered by the patterned positive photoresist layer is remained, and another part of the conductive material layer not covered by the patterned positive photoresist layer is etched. In this way, the residual conductive material layer is formed into the required conductive structure layer. As shown in FIG. 10 (only conductive leads 550 are shown), the residual positive photoresist layer is removed, thereby obtaining the required conductive structure layer with conductive leads 550.

In the mask of the present disclosure, the widths of the first splicing light-shielding strip 121 and the corresponding second splicing light-shielding strip 221 are different, the width of one of which is equal to the target width, and the width of the other is the first auxiliary width. When the width of the first splicing light-shielding strip 121 is equal to the target width, the first auxiliary splicing pattern 1211 is located within the corresponding second splicing light-shielding strip 221; and when the width of the first splicing light-shielding strip 121 is equal to the first auxiliary width, the first auxiliary splicing pattern 1211 covers the corresponding second splicing light-shielding strip 221. Therefore, the width of the positive photoresist layer eventually shielded by the first splicing light-shielding strip 121 and the corresponding second splicing light-shielding strip 221 is equal to the target width.

Exemplarily, as shown in FIGS. 1 and 2, the width of the first splicing light-shielding strip 121 is equal to the target width, and the width of the second splicing light-shielding strip 221 is equal to the first auxiliary width; and during the first exposure, as shown in FIG. 7, the second splicing light-shielding strip 221 causes the positive photoresist layer to be formed into an unexposed second regions 542 in the first repeat exposure region 501. As shown in FIG. 8, during the second exposure, the first splicing light-shielding strip 121 causes the positive photoresist layer to be formed into the unexposed first regions 541 in the first repeat exposure region 501, and the first region 541 is located within the second region 542. Since only the positive photoresist within the region unexposed for twice can be remained in the development operation, only the positive photoresist within the overlapping region of the first region 541 and the second region 542 can be remained in the development operation; and the overlapping region of the first region 541 and the second region 542 exactly coincides with the first region 541, so the width of the positive photoresist layer eventually shielded in the two exposures is the target width. Moreover, even if alignment offset occurs during the exposure process, one or both of the first region 541 and the second region 542 may be offset. Since the first region 541 is located within the second region 542, even if the positions of both the first region 541 and the second region 542 are offset, the first region 541 is not likely to be partially shifted out of the second region 542, so it is still ensured that the overlapping region of the first region 541 and the second region 542 exactly coincides with the first region 541, thereby ensuring that the width of the positive photoresist layer eventually shielded in the two exposures is equal to the target width.

Similarly, in the case that the width of the second splicing light-shielding strip 221 is the target width, and the width of the first splicing light-shielding strip 121 is the first auxiliary width, the width of the positive photoresist layer eventually shielded in the two exposures is also equal to the target width.

In some embodiments, the first auxiliary width is equal to 1.2 to 2 times the target width. In this way, it can be ensured that when an offset within a reasonable range occurs in the exposure operation, the width of the conductive lead 550 within the first repeat exposure region 501 can still be formed as the required width, and the wiring density can be prevented from being limited by a large size of the first auxiliary width. In some further embodiments, the first auxiliary width is equal to 1.5 to 2 times the target width.

Optionally, the first auxiliary width is at least 3 microns larger than the target width to ensure that when an offset within a reasonable range occurs in the exposure operation, the width of the conductive lead 550 within the first repeat exposure region 501 can still be formed as the required width.

In some further embodiments, after translation along the first vector u1, the pattern of the first splicing light-shielding strip 121 is formed into the first auxiliary splicing pattern 1211, the first auxiliary splicing pattern 1211 may have a virtual first auxiliary equidistant line between two edges along its extending direction, and the distances between any point on the first auxiliary equidistant line and the two edges of the first auxiliary splicing pattern 1211 along its extending direction are the same. The second splicing light-shielding strip 221 corresponding to the first splicing light-shielding strip 121 may have a virtual second auxiliary equidistant line between the two edges along its extending direction, and the distances between any point on the second auxiliary equidistant line and the two edges of the second splicing light-shielding strip 221 along its extending direction are the same. The first auxiliary equidistant line and the second auxiliary equidistant line completely coincide. In this way, a wilder alignment process window in the second direction B can be ensured for the two exposure operations, and a relatively small alignment process window can be avoided on a unilateral direction of the second direction B, thereby further ensuring that the width of the conductive lead 550 in the first repeat exposure region 501 is the required width.

In some embodiments, the direction of the first vector u1 is parallel to the first direction to facilitate motion of an exposure machine or a mask during the splicing exposure.

Optionally, as shown in FIGS. 1 and 2, the first graphic region 100 may further include a first independent exposure region 110, the first independent exposure region 110 is disposed adjacent to the first splicing exposure region 120 along the first direction A; and the second graphic region 200 may further include a second independent exposure region 210, the second independent exposure region 210 is disposed adjacent to the second splicing exposure region 220 along the first direction A. As shown in FIG. 3, after translation along the first vector u1, the first independent exposure region 110 can be formed into a first independent auxiliary region 1101, and the first independent auxiliary region 1101 and the second independent exposure region 210 are located on both sides of the second splicing exposure region 220, respectively.

Any one of the light-shielding strips 010 further includes a first independent light-shielding strip 111 and a second independent light-shielding strip 211 disposed respectively corresponding to the first splicing light-shielding strip 121 and the second splicing light-shielding strip 221; the first independent light-shielding strip 111 is provided in the first independent exposure region 110 and connected with the corresponding first splicing light-shielding strip 121, and penetrates the first independent exposure region 110 in the first direction A; the second independent light-shielding strip 211 is provided in the second independent exposure region 210 and connected with the corresponding second splicing light-shielding strip 221, and penetrates the second independent exposure region 210 in the first direction A; and the widths of the first independent light-shielding strip 111 and the second independent light-shielding strip 211 are both equal to the target width.

In this way, as shown in FIGS. 7, 8 and 10, after the exposure operations are respectively performed on the first patterned region 510 and the second patterned region 520 of the backplate 500 by using the first graphic region 100 and the second graphic region 200 of the mask, the conductive lead 550 can be formed after development and etching, where the width of the conductive lead 550 in the region where the first patterned region 510 and the second patterned region 520 are not overlapped is the required width, and the width thereof in the first repeat exposure region 501 is also the required width. In this way, the conductive lead 550 can be prepared with uniform width by means of the splicing exposure process, thereby further improving the uniformity of the conductive lead 550, as well as the uniformity of the display panel, and especially, the uniformity between the conductive leads 550 of different display panels.

In some embodiments, on the mask, as shown in FIGS. 1 and 2, the second graphic region 200, the first light-shielding band 410 and the first graphic region 100 are sequentially spaced apart and arranged along the first direction A, where the first splicing exposure region 120 and the second splicing exposure region 220 are both located between the first independent exposure region 110 and the second independent exposure region 210. In this way, the first graphic region 100 and the second graphic region 200 of the mask are facilitated to be aligned with the first patterned region 510 and the second patterned region 520 of the backplate 500, respectively, thereby reducing movement of the backplate 500 and the mask aligner (lithography) during the splicing exposure.

Figure 4:
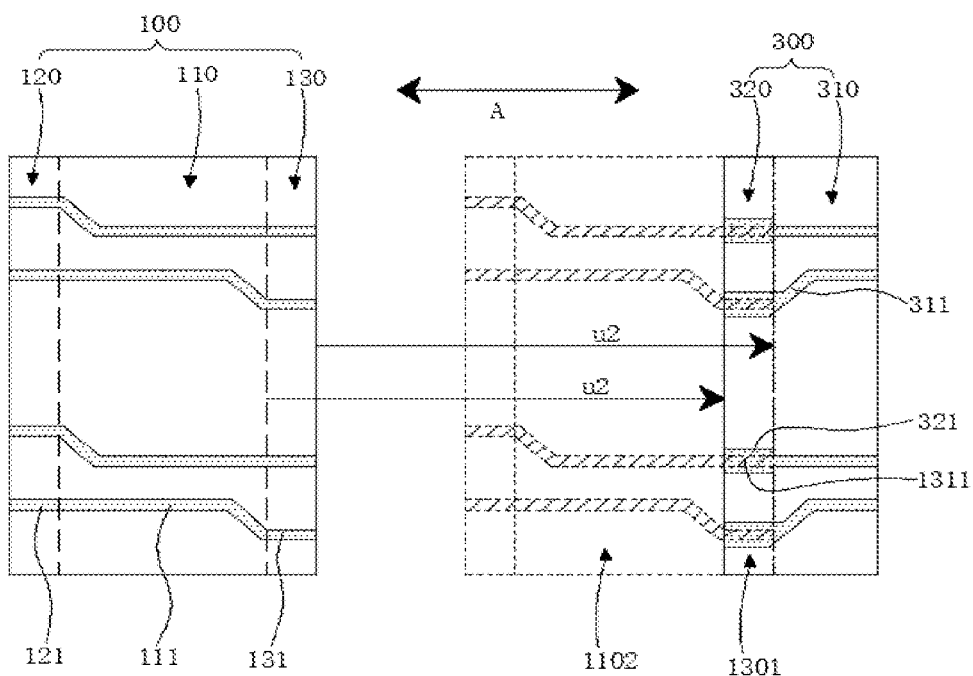
FIG. 4 is a schematic diagram of translating a pattern of a first graphic region along a second vector in a mask according to some embodiments of the present disclosure.

In some embodiments, as shown in FIGS. 1 and 2, the mask may further include a third graphic region 300, the third graphic region 300 includes a third independent exposure region 310 and a third splicing exposure region 320 adjacently disposed along the first direction A; and the first graphic region 100 may further include a fourth splicing exposure region 130, and the fourth splicing exposure region 130 and the first splicing exposure region 120 are located at both sides of the first independent exposure region 110, respectively. As shown in FIG. 4, after translation along a second vector u2, the fourth splicing exposure region 130 can be formed into a second splicing auxiliary region 1301, the second splicing auxiliary region 1301 coincides with the third splicing exposure region 320; and after translation along the second vector u2, the first independent exposure region 110 can be formed into a second independent auxiliary region 1102, and the second independent auxiliary region 1102 and the third independent exposure region 310 are located at both sides of the third splicing exposure region 320, respectively.

As shown in FIGS. 1 and 2, the light-shielding strip 010 further includes a third splicing light-shielding strip 321, a fourth splicing light-shielding strip 131 and a third independent light-shielding strip 311 disposed respectively corresponding to the first splicing light-shielding strip 121, the second splicing light-shielding strip 221, the first independent light-shielding strip 111 and the second independent light-shielding strip 211; the third independent light-shielding strip 311 is provided in the third independent exposure region 310, and penetrates the third independent exposure region 310 in the first direction A; the width of the third independent light-shielding strip 311 is equal to the target width; the third splicing light-shielding strip 321 is provided in the third splicing exposure region 320 and connected with the corresponding third independent light-shielding strip 311, and penetrates the third splicing exposure region 320 in the first direction A; and the fourth splicing light-shielding strip 131 is provided in the fourth splicing exposure region 130 and connected with the corresponding first independent light-shielding strip 111, and penetrates the fourth splicing exposure region 130 in the first direction A.

Of the fourth splicing light-shielding strip 131 and the corresponding third splicing light-shielding strip 321, the width of one is equal to the target width, the width of the other is equal to a second auxiliary width, and the second auxiliary width is greater than the target width. As shown in FIG. 4 (the situation that the width of the fourth splicing light-shielding strip 131 is equal to the second auxiliary width is not shown), after translation along the second vector u2, the pattern of the fourth splicing light-shielding strip 131 can be formed into a second auxiliary splicing pattern 1311; and the second auxiliary splicing pattern 1311 is located within the corresponding third splicing light-shielding strip 321, or the second auxiliary splicing pattern 1311 covers the corresponding third splicing light-shielding strip 321. In other words, when the width of the fourth splicing light-shielding strip 131 is equal to the target width, the second auxiliary splicing pattern 1311 is located within the corresponding third splicing light-shielding strip 321; and when the width of the fourth splicing light-shielding strip 131 is equal to the second auxiliary width, the second auxiliary splicing pattern 1311 covers the corresponding third splicing light-shielding strip 321.

Figure 9:
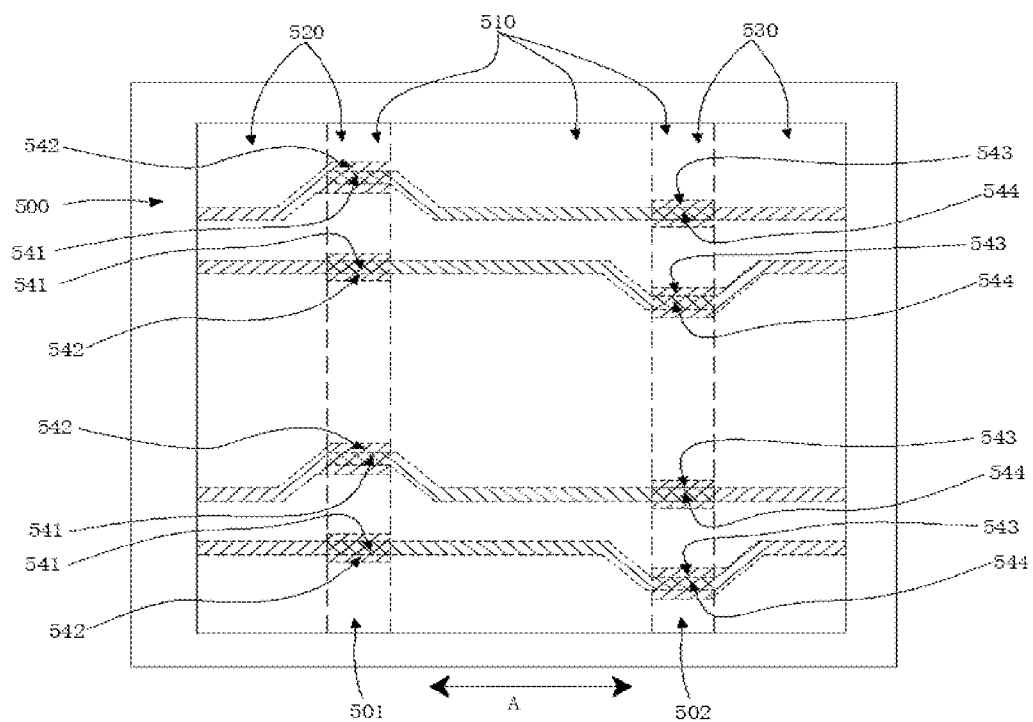
FIG. 9 is a schematic diagram of regions shielded by light-shielding strips when a third patterned region is exposed in some embodiments of the present disclosure.

In this way, as shown in FIG. 6, the backplate 500 may further include a third patterned region 530, and along the first direction A, the third patterned region 530 and the second patterned region 520 are located on both sides of the first patterned region 510, respectively. The third patterned region 530 and the first patterned region 510 partially coincide, and the region where the both coincide is a second repeat exposure region 502. As shown in FIG. 9, during the exposure operation, the third graphic region 300 of the mask may be aligned with the third patterned region 530 of the backplate 500 for exposure, and the third splicing exposure region 320 of the mask and the fourth splicing exposure region 130 of the mask are both aligned with the second repeat exposure region 502 of the backplate 500 during the exposure operation. In this way, when the splicing exposure operation is performed by means of the mask of the present disclosure, as shown in FIG. 10, the conductive lead 550 sequentially crosses the first patterned region 510, the second patterned region 520 and the third patterned region 530 of the backplate 500.

Exemplarily, as shown in FIGS. 1, 8 and 9, the width of the fourth splicing light-shielding strip 131 is equal to the target width, and the width of the third splicing light-shielding strip 321 is equal to the second auxiliary width; and in one exposure, the fourth splicing light-shielding strip 131 causes the positive photoresist layer to be formed into an unexposed fourth region 544, and the in the other exposure, the third splicing light-shielding strip 321 causes the positive photoresist layer to be formed into the unexposed third region 543, and the fourth region 544 is located within the third region 543. Since only the positive photoresist within the region unexposed for twice can be remained in the development operation, only the positive photoresist within the overlapping region of the third region 543 and the fourth region 544 can be remained in the development operation; and the overlapping region of the third region 543 and the fourth region 544 exactly coincides with the fourth region 544, so the width of the positive photoresist layer eventually shielded in the two exposures is the target width. Moreover, if alignment offset occurs during the exposure operation, such offset may occur in one or both of the third region 543 and the fourth region 544. Since the fourth region 544 is located within the third region 543, even if the offset occurs at the positions of the third region 543 and the fourth region 544, the fourth region 544 is not likely to be partially shifted out of the third region 543, so it still can be ensured that the overlapping region of the region 543 and the fourth region 544 exactly coincides with the fourth region 544, thereby ensuring that the width of the positive photoresist layer eventually shielded in the tow exposure is equal to the target width. In this way, the mask of the present disclosure can ensure that the width of the conductive lead 550 within the third patterned region 530 is the required width, and especially ensures that the width of the conductive lead 550 within the second repeat exposure region 502 is the required width. Therefore, the mask of the present disclosure can be used to pattern the conductive material layer through exposure for three times (including the splicing exposure for twice).

Optionally, the width of the fourth splicing light-shielding strip 131 is equal to the target width, and the width of the third splicing light-shielding strip 321 is equal to the second auxiliary width.

In some embodiments, the second auxiliary width is equal to 1.2 to 2 times the target width. In this way, it can be ensured that when an offset within a reasonable range occurs in the exposure operation, the width of the conductive lead 550 within the second repeat exposure region 502 can still be formed as the required width, and the wiring density can be prevented from being limited by a large size of the second auxiliary width. In some further embodiments, the second auxiliary width is equal to 1.5 to 2 times the target width.

Optionally, the second auxiliary width is at least 3 microns larger than the target width to ensure that when an offset within a reasonable range occurs in the exposure operation, the width of the conductive lead 550 within the second repeat exposure region 502 can still be formed as the required width.

In some further embodiments, after translation along the second vector u2, the pattern of the fourth splicing light-shielding strip 131 is formed into the second auxiliary splicing pattern 1311, the second auxiliary splicing pattern 1311 may a one virtual fourth auxiliary equidistant line between two edges along its extending direction, and the distances between any point on the fourth auxiliary equidistant line and the two edges of the second auxiliary splicing pattern 1311 along its extending direction are the same. The third splicing light-shielding strip 321 corresponding to the fourth splicing light-shielding strip 131 may have a virtual third auxiliary equidistant line between the two edges along its extending direction, the distances between any point on the third auxiliary equidistant line and the two edges of the third splicing light-shielding strip 321 along its extending direction are the same. The third auxiliary equidistant line and the fourth auxiliary equidistant line completely coincide. In this way, a wilder alignment process window in the second direction B can be ensured for the two exposure operations, and a relatively small alignment process window can be avoided on a unilateral direction of the second direction B, thereby further ensuring that the width of the conductive lead 550 in the second repeat exposure region 502 is the required width.

In some embodiments, the direction of the second vector u2 is parallel to the first direction to facilitate motion of the exposure machine or the mask during splicing exposure.

In some embodiments, as shown in FIGS. 1 and 2, on the mask, the second graphic region 200, the first light-shielding band 410, the first graphic region 100, the second light-shielding band 420 and the third graphic region 300 are sequentially spaced apart and arranged along the first direction A, where the first splicing exposure region 120 and the second splicing exposure region 220 are both located between the first independent exposure region 110 and the second independent exposure region 210, and the third splicing exposure region 320 and the fourth splicing exposure region 130 are both located between the first independent exposure region 110 and the third independent exposure region 310. In this way, the first graphic region 100, the second graphic region 200 and the third graphic region 300 of the mask are facilitated to be aligned with the first patterned region 510, the second patterned region 520 and the third patterned region 530 of the backplate 500, thereby reducing movement of the backplate 500 and the mask aligner (lithography) during splicing exposure. During the exposure operation, the exposure operations may be sequentially performed on the second patterned region 520, the first patterned region 510 and the third patterned region 530, or the exposure operations may be sequentially performed on the third patterned region 530, the first patterned region 510 and the second patterned region 520.

In some embodiments, through deigning the shapes and the widths of the fourth splicing light-shielding strip 131 and the first splicing light-shielding strip 121, the splicing exposure can be performed by reusing the first graphic region 100, and the prepared conductive lead 550 is a non-continuous structure. For example, the conductive lead 550 may be divided into a first conductive lead segment and a second conductive lead segment that are not continuous.

In a large-size display panel, the IR drop may be too large if the length of the conductive lead 550 is too large, which prevents from improving the charging rate during driving. Therefore, the large-size display panel may drive the conductive lead 550 at both ends of the conductive lead 550, respectively. However, driving the conductive lead 550 at both ends of the conductive lead 550 simultaneously is likely to generate signal interference, which prevents from improving the display quality of the display panel. Compared with a continuous conductive lead 550, the lengths of the first conductive lead segment and the second conductive lead segment are shorter, the impedance is smaller, and therefore, the IR drops of the signal on the first conductive lead segment and on the second conductive lead segment are smaller. In this way, the first conductive lead segment and the second conductive lead segment may be driven, respectively, thereby avoiding the signal interference problem caused by driving at both sides simultaneously, and improving the display quality of the display panel.

Figure 5:
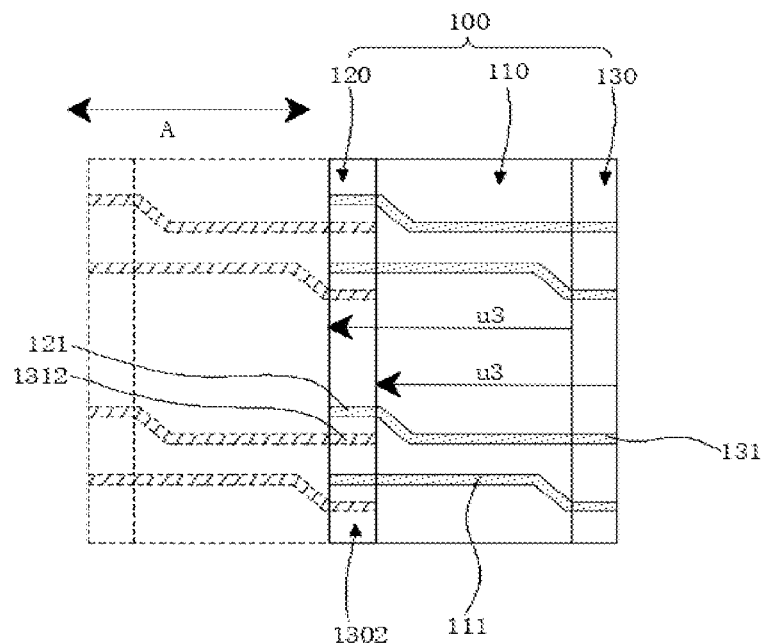
FIG. 5 is a schematic diagram of translating a pattern of a first graphic region along a third vector in a mask according to some embodiments of the present disclosure.

In some embodiments of the present disclosure, as shown in FIG. 5, after translation along a third vector u3, the fourth splicing exposure region 130 can be formed into a third splicing auxiliary region 1302, the third splicing auxiliary region 1302 coincides with the first splicing exposure region 120; after translation along the third vector u3, the pattern of fourth splicing light-shielding strip 131 can be formed into a third auxiliary splicing pattern 1312. The first splicing light-shielding strip 121 is provided with at least a sacrificial light-shielding segment along its extending direction, and the sacrificial light-shielding segment is completely non-overlapped with the third auxiliary splicing pattern 1312. In other words, the first splicing light-shielding strip 121 is provided with the sacrificial light-shielding segment, the sacrificial light-shielding segment is a certain segment of the first splicing light-shielding strip 121, and its width is the same as the width of the first splicing light-shielding strip 121. When the sacrificial light-shielding segment is removed, the first splicing light-shielding strip 121 is non-continuous, and the sacrificial light-shielding segment is completely non-overlapped with the third auxiliary splicing pattern 1312.

Figure 11:
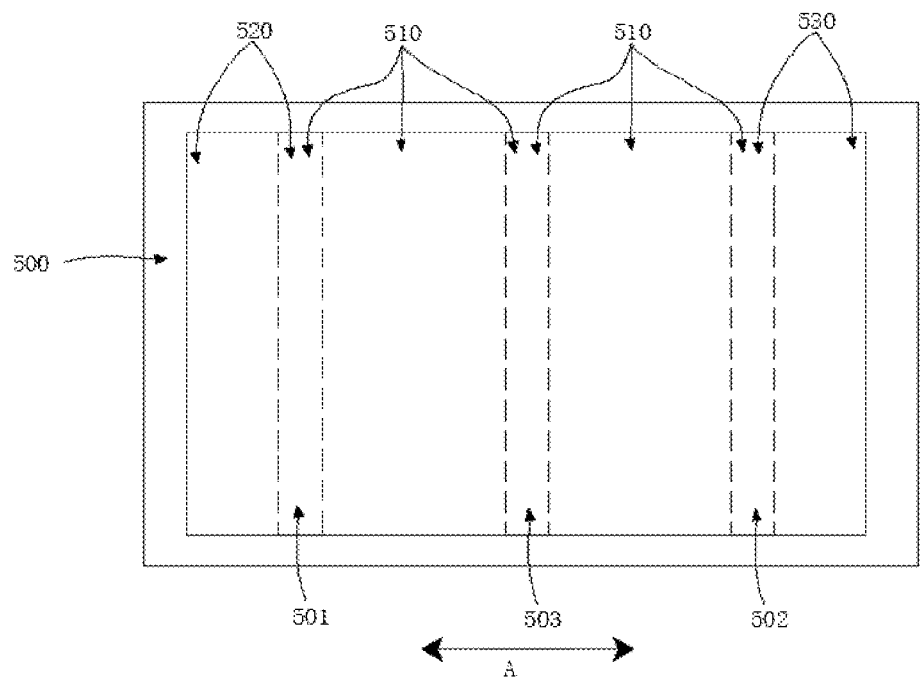
FIG. 11 is a schematic diagram of a backplate in some embodiments of the present disclosure.
Figure 12:
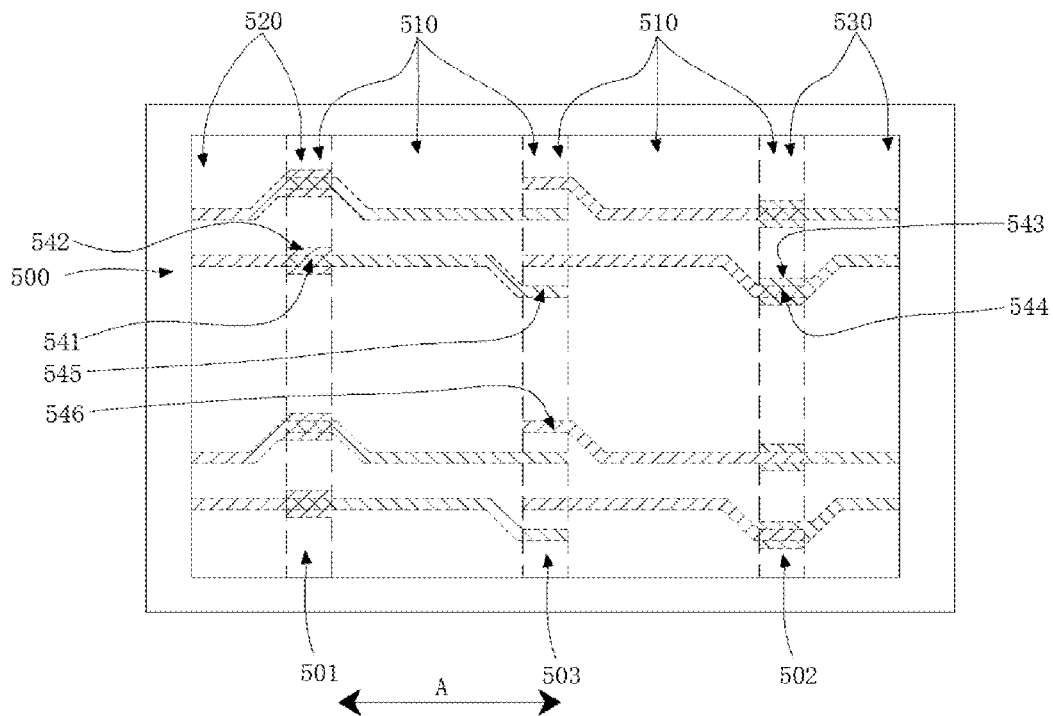
FIG. 12 is a schematic diagram of regions shielded by light-shielding strips when each patterned region is sequentially exposed in some embodiments of the present disclosure.
Figure 13:
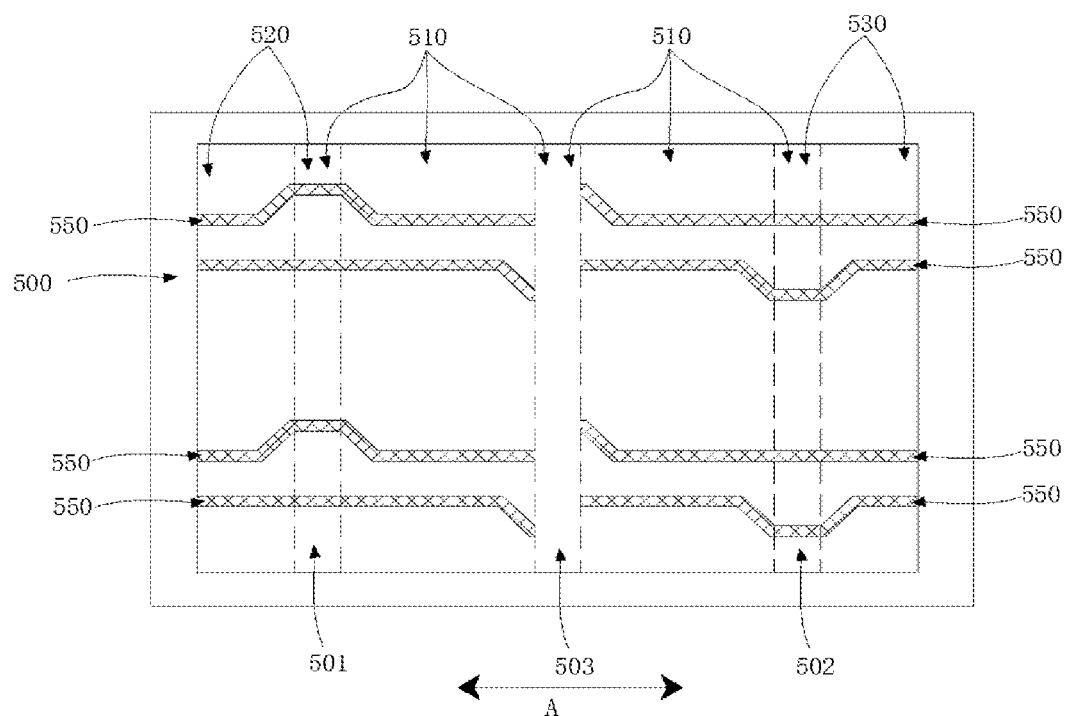
FIG. 13 is a schematic diagram of conductive leads in some embodiments of the present disclosure.
Figure 14:
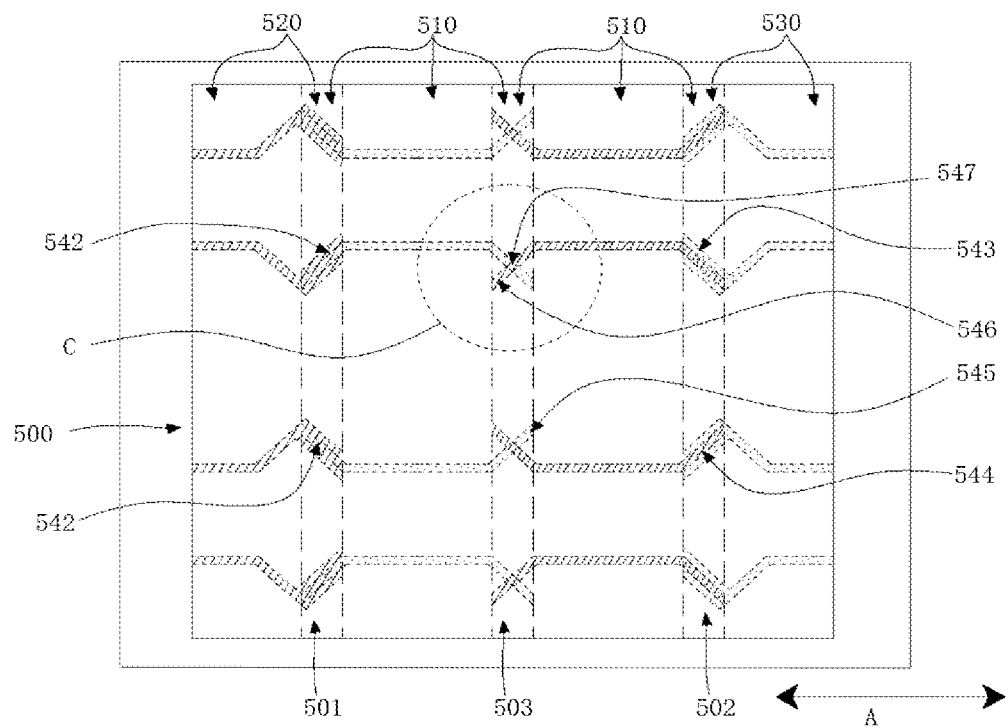
FIG. 14 is a schematic diagram of regions shielded by light-shielding strips when each patterned region is sequentially exposed in some embodiments of the present application.
Figure 16:
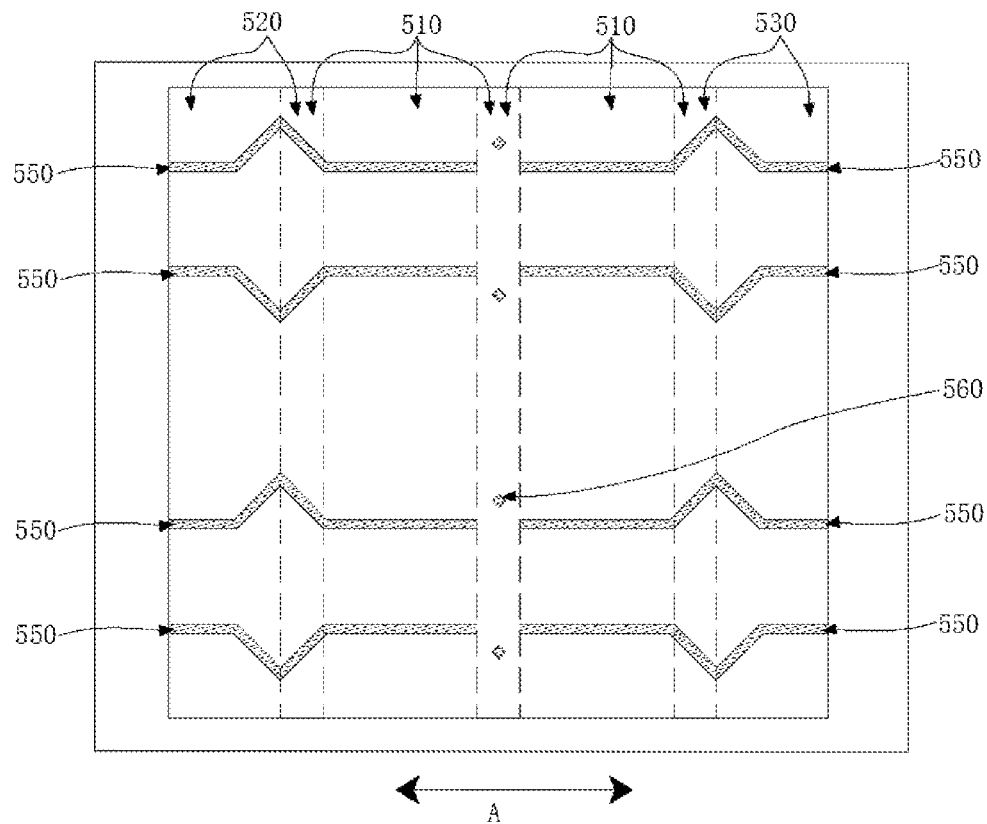
FIG. 16 is a schematic diagram of conductive leads in some embodiments of the present disclosure.

In this way, as shown in FIG. 11, the backplate 500 may be provided with two first patterned regions 510 sequentially arranged along the first direction A between the third patterned region 530 and the second patterned region 520, the first patterned region 510 close to the second patterned region 520 overlaps with the second patterned region 520 in the first repeat exposure region 501, the first patterned region 510 close to the third patterned region 530 overlaps with the third patterned region 530 in the second repeat exposure region 502, and the two first patterned regions 510 partially overlap with each other and the overlapping region is a third repeat exposure region 503. In this way, during the exposure operation, as shown in FIGS. 12 and 14, the fourth splicing exposure region 130 and the first splicing exposure region 120 may be used to expose the third repeat exposure region 503, respectively, by aligning the first graphical region 100 with the two first patterned regions 510 of the backplate 500 for exposure. In the third repeat exposure region 503, during exposure using the fourth splicing exposure region 130, the fourth splicing light-shielding strip 131 causes the positive photoresist layer to be formed into an unexposed fifth region 545; and during exposure using the first splicing exposure region 120, the first splicing light-shielding strip 121 causes the positive photoresist layer to be formed into an unexposed sixth region 546. Only the positive photoresist within the region unexposed for twice can be remained in the development operation, so only the positive photoresist within the overlapping region of the fifth region 545 and the sixth region 546 can be remained in the development operation. However, since the first splicing light-shielding strip 121 is provided with the sacrificial light-shielding segment, the overlapping region of the fifth region 545 and the sixth region 546 necessarily cannot continuously penetrate the third repeat exposure region 503. As shown in FIGS. 13 and 16, this causes the conductive lead 550 to be not continuous within the third repeat exposure region 503.

Optionally, the size of the first splicing exposure region 120 along the first direction A is equal to 1.5 to 8 times the target width. In this way, it can be ensured that while the conductive lead 550 is disconnected in the third repeat exposure region 503, the change of the electrical environment within the third repeat exposure region 503 is reduce, the overall uniformity of the display panel is avoided from being decreased, and the display quality of the display panel is ensured. In some embodiments of the present disclosure, the width of the first splicing exposure region 120 along the first direction A may be 10 to 55 microns. In some embodiments, the width of the first splicing exposure region 120 along the first direction A may be 20 to 45 microns.

For example, in some embodiments of the present application, as shown in FIG. 1, a plurality of light-shielding strip groups 020 may be formed by a plurality of light-shielding strips, and any one of the light-shielding strip groups 020 includes a previous light-shielding strip 010a and a latter light-shielding strip 010b adjacently disposed.

In one light-shielding strip group 020, one end of the first independent light-shielding strip 111 of the previous light-shielding strip 010a close to the first splicing exposure region 120 is bent towards the direction away from the latter light-shielding strip 010b, one end of the second independent light-shielding strip 211 of the previous light-shielding strip 010a close to the second splicing exposure region 220 is bent towards the direction away from the latter light-shielding strip 010b, one end of the first independent light-shielding strip 111 of the latter light-shielding strip 010b close to the fourth splicing exposure region 130 is bent towards the direction away from the previous light-shielding strip 010a, and one end of the third independent light-shielding strip 311 of the latter light-shielding strip 010b close to the third splicing exposure region 320 is bent towards the direction away from the previous light-shielding strip 010a.

In this way, as shown in FIG. 12, within the third repeat exposure region 503, the third region 543 and the fourth region 544 are completely non-overlapped; and as shown in FIG. 13, this causes that the conductive lead 550 and its residue part are not formed within the third repeat exposure region 503, so that the conductive lead 550 is spaced apart by the third repeat exposure region 503.

Optionally, the size of the first splicing exposure region 120 along the first direction A is equal to 1.5 to 4 times the target width. In this way, on the premise that the conductive lead 550 is disconnected in the third repeat exposure region 503, the width of the third repeat exposure region 503 can be reduced, disconnection of the conductive lead 550 can be prevented from being too great due to a large width of the third repeat exposure region 503, thereby avoiding the change of the electrical environment within the third repeat exposure region 503 due to great disconnection of the conductive lead. Accordingly, the decrease in the overall uniformity of the display panel is avoided, and the display quality of the display panel is ensured. In some embodiments of the present application, the width of the first splicing exposure region 120 along the first direction A may be 10 to 30 microns. In some embodiments, the width of the first splicing exposure region 120 along the first direction A may be 20 micron.

In some other embodiments of the present disclosure, as shown in FIG. 2, a plurality of light-shielding strip groups 020 are formed by a plurality of light-shielding strips 010, and any one of the light-shielding strip groups 020 includes a previous light-shielding strip 010a and a latter light-shielding strip 010b adjacently disposed; and in any one of the light-shielding strip groups 020:

one end of the second independent light-shielding strip 211 of the previous light-shielding strip 010a close to the second splicing exposure region 220 is bent towards the direction away from the latter light-shielding strip 010b, one end of the third independent light-shielding strip 311 of the previous light-shielding strip 010a close to the third splicing exposure region 320 is bent towards the direction away from the latter light-shielding strip 010b, one end of the second independent light-shielding strip 211 of the latter light-shielding strip 010b close to the second splicing exposure region 220 is bent towards the direction away from the previous light-shielding strip 010a, and one end of the third independent light-shielding strip 311 of the latter light-shielding strip 010b close to the third splicing exposure region 320 is bent towards the direction away from the previous light-shielding strip 010a;

along the direction away from the first independent exposure region 110, first splicing light-shielding strip 121 of the previous light-shielding strip 010*a* extends towards the direction away from the latter light-shielding strip 010*b*, the first splicing light-shielding strip 121 of the latter light-shielding strip 010*b* extends towards the direction away from the previous light-shielding strip 010*a*, the fourth splicing light-shielding strip 131 of the previous light-shielding strip 010*a* extends towards the direction away from the latter light-shielding strip 010*b*, and the fourth splicing light-shielding strip 131 of the latter light-shielding strip 010*b* extends towards the direction away from the previous light-shielding strip 010*a*;

along the direction away from second independent exposure region 210, the second splicing light-shielding strip 221 of the previous light-shielding strip 010*a* extends towards the direction close to the latter light-shielding strip 010*b*, and the second splicing light-shielding strip 221 of the latter light-shielding strip 010*b* extends towards the direction close to the previous light-shielding strip 010*a*; and along the direction away from the third independent exposure region 310, the third splicing light-shielding strip 321 of the previous light-shielding strip 010*a* extends towards the direction close to the latter light-shielding strip 010*b*, and the third splicing light-shielding strip 321 of latter the light-shielding strip 010*b* extends towards the direction close to the previous light-shielding strip 010*a*.

Figure 15:
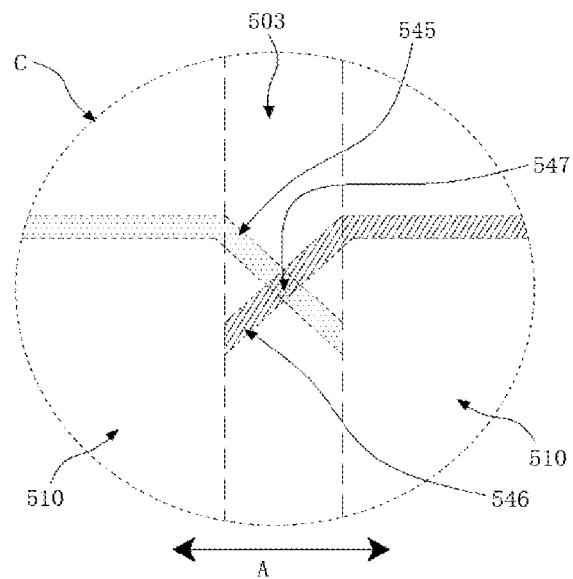
FIG. 15 is a partial enlarged view of the region C in FIG. 14.

In this way, as shown in FIGS. 14 and 15, within the third repeat exposure region 503, the fifth region 545 and the sixth region 546 partially overlap with each other, and an overlapping region 547 is formed. Since the first splicing light-shielding strip 121 and the fourth splicing light-shielding strip 131 are both oblique lines that forms certain angles with the first direction A, the overlapping region 547 is located in the middle of the third repeat exposure region 503 and not connected with an edge of the third repeat exposure region 503. In this way, as shown in FIG. 16, a plurality of conductive segments 560 are formed at the position of the overlapping region 547 within the third repeat exposure region 503, and neither one of the conductive segments 560 is connected with the conductive lead 550, thereby disconnecting the conductive lead 550 by the third repeat exposure region 503.

Optionally, the size of the first splicing exposure region 120 along the first direction A is equal to 4 to 8 times of the target width. In this way, the third repeat exposure region 503 may be set to have a relative large width, thereby preventing the overlapping region 547 from being connected with an edge of the third repeat exposure region 503, so as to ensure that the conductive lead 550 is disconnected in the third repeat exposure region 503. At the same time, similar to the conductive lead 550, there may be interaction, for example, mutual coupling, between the conductive segment 560 and another film of the display panel, thereby reducing the change of the electrical environment within the third repeat exposure region 503. Accordingly, the overall uniformity of the display panel is prevented from being decreased, and the display quality of the display panel can be ensured. In some embodiments of the present application, the width of the first splicing exposure region 120 along the first direction A may be 35 to 55 microns. In some embodiments, the width of the first splicing exposure region 120 along the first direction A may be 45 microns.

It can be understood that in some other embodiments, through designing the shapes and widths of the fourth splicing light-shielding strip 131 and the first splicing light-shielding strip 121, the first graphic region 100 may be repeatedly reused for repeated splicing exposures, and wilder display panel with continuous conductive lead 550 can be prepared. For example, in some embodiments of the present application, after translation along the third vector u3, the fourth splicing exposure region 130 can be formed in to the third splicing auxiliary region 1302, and the third splicing auxiliary region 1302 coincides with the first splicing exposure region 120. In the first splicing light-shielding strip 121 and its corresponding fourth splicing light-shielding strip 131, only the width of one is equal to the target width. After translation along the third vector u3, the pattern of the fourth splicing light-shielding strip 131 can be formed into the third auxiliary splicing pattern 1312; and the third auxiliary splicing pattern 1312 is located within the corresponding first splicing light-shielding strip 121, or the third auxiliary splicing pattern 1312 covers the corresponding first splicing light-shielding strip 121. In other words, when the width of the fourth splicing light-shielding strip 131 is equal to the target width, the width of the first splicing light-shielding strip 121 is equal to the first auxiliary width, and the third auxiliary splicing pattern 1312 is located within the corresponding first splicing light-shielding strip 121; and when the width of the fourth splicing light-shielding strip 131 is not equal to the target width, the width of the fourth splicing light-shielding strip 131 is equal to the second auxiliary width, the width of the first splicing light-shielding strip 121 is equal to the target width, and the third auxiliary splicing pattern 1312 covers the corresponding first splicing light-shielding strip 121.

In this way, the backplate 500 may be provided with a plurality of first patterned regions 510 sequentially arranged along the first direction A between third patterned region 530 and second patterned region 520, the first patterned region 510 closest to the second patterned region 520 coincides with the second patterned region 520 in the first repeat exposure region 501, the first patterned region 510 closest to the third patterned region 530 coincides with the third patterned region 530 in the second repeat exposure region 502, two adjacent first patterned regions 510 partially coincide with each other, and the coinciding region is the third repeat exposure region 503. In this way, during the exposure operation, exposures can be performed by respectively aligning the first graphic region 100 with each first patterned region 510 of the backplate 500. Based on the same principle as that the width of the conductive lead 550 within the first repeat exposure region 501 is the required width, the mask of the present disclosure can ensure that the width of the conductive lead 550 within each first patterned region 510 is the required width, and especially ensure that the width of the conductive lead 550 within the third repeat exposure region 503 is the required width. Therefore, the mask of the present disclosure can be used for preparing the conductive lead 550 with the required width in the manner of repeated splicing exposure by reusing the first graphic region 100, and the prepared conductive lead 550 is a continuous conductive lead 550.

In some embodiments, after translation along the third vector u3, the pattern of the fourth splicing light-shielding strip 131 is formed into the third auxiliary splicing pattern 1312. The third auxiliary splicing pattern may can have a virtual fifth auxiliary equidistant line between two edges along its extending direction, and the distances between any point on the fifth auxiliary equidistant line and the two edges of the third auxiliary splicing pattern 1312 along its extending direction are the same. The first splicing light-shielding strip 121 corresponding to the fourth splicing light-shielding strip 131 may have a virtual sixth auxiliary equidistant line between two edges along its extending direction, the distances between any point on the sixth auxiliary equidistant line and the two edges of the first splicing light-shielding strip 121 along its extending direction are the same. The fifth auxiliary equidistant line and the sixth auxiliary equidistant line completely coincide. In this way, a wilder alignment process window in the second direction B can be ensured for the two exposures, and a relatively small alignment process window can be avoided on a unilateral direction of the second direction B, thereby further ensuring that the width of the conductive lead 550 in the third repeat exposure region 503 is the required width.

It should be understood that the present disclosure does not limit an application thereof to the detailed structure and arrangement manner of a component proposed by the present specification. The present disclosure can have other embodiments, and can be implemented and executed in various manners. The foregoing variation and modification fall within the scope of the present disclosure. It should be understood that the present disclosure disclosed and defined by the present specification extends to all alternative combinations of two or more than two individual features mentioned or apparent herein and/or in the drawings. All these different combinations constitute multiple alternative aspects of the present disclosure. The embodiments of the present specification illustrate the best manner known for implementing the present disclosure, and will enable those skilled in the art to use the present disclosure.

What is claimed is:

1. A mask, comprising:
   a first graphic region and a second graphic region disposed along a first direction, and a third graphic region, wherein the first graphic region comprises a first splicing exposure region, the second graphic region comprises a second splicing exposure region, the first splicing exposure region is used for, after being translated along a first vector, forming a first splicing auxiliary region, and the first splicing auxiliary region coincides with the second splicing exposure region;
   a plurality of light-shielding strips arranged along a second direction, the second direction being perpendicular to the first direction, wherein any one of the light-shielding strips comprises a first splicing light-shielding strip and a second splicing light-shielding strip correspondingly disposed, the first splicing light-shielding strip is provided in the first splicing exposure region, and penetrates the first splicing exposure region in the first direction, and the second splicing light-shielding strip is provided in the second splicing exposure region, and penetrates the second splicing exposure region in the first direction; and
   a width of one of the first splicing light-shielding strip and corresponding second splicing light-shielding strip is equal to a target width, a width of the other one is equal to a first auxiliary width, and the first auxiliary width is greater than the target width, a pattern of the first splicing light-shielding strip is used for, after being translated along the first vector, forming a first auxiliary splicing pattern, and the first auxiliary splicing pattern is located within the corresponding second splicing light-shielding strip, or the first auxiliary splicing pattern covers the corresponding second splicing light-shielding strip, wherein:
   the first graphic region further comprises a first independent exposure region, the first independent exposure region is disposed adjacent to the first splicing exposure region along the first direction, the second graphic region further comprises a second independent exposure region, the second independent exposure region is disposed adjacent to the second splicing exposure region along the first direction, the first independent exposure region is used for, after being translated along the first vector, forming a first independent auxiliary region, and the first independent auxiliary region and the second independent exposure region are located on both sides of the second splicing exposure region, respectively;
   any one of the light-shielding strips further comprises a first independent light-shielding strip disposed corresponding to the first splicing light-shielding strip and a second independent light-shielding strip disposed corresponding to the second splicing light-shielding strip, the first independent light-shielding strip is provided in the first independent exposure region and connected with corresponding first splicing light-shielding strip, and penetrates the first independent exposure region in the first direction, and the second independent light-shielding strip is provided in the second independent exposure region and connected with corresponding second splicing light-shielding strip, and penetrates the second independent exposure region in the first direction;
   widths of the first independent light-shielding strip and the second independent light-shielding strip are both equal to the target width;
   the third graphic region comprises a third independent exposure region and a third splicing exposure region adjacently disposed along the first direction, the first graphic region further comprises a fourth splicing exposure region, and the fourth splicing exposure region and the first splicing exposure region are disposed on both sides of the first independent exposure region, respectively;
   the fourth splicing exposure region is used for, after being translated along a second vector, forming a second splicing auxiliary region, and the second splicing auxiliary region coincides with the third splicing exposure region, and the first independent exposure region is used for, after being translated along the second vector, forming a second independent auxiliary region, and the second independent auxiliary region and the third independent exposure region are located on both sides of the third splicing exposure region, respectively;
   the light-shielding strips further comprise a third splicing light-shielding strip disposed corresponding to the first splicing light-shielding strip, a fourth splicing light-shielding strip disposed corresponding to the second splicing light-shielding strip, and a third independent light-shielding strip disposed corresponding to the first independent light-shielding strip and the second independent light-shielding strip, the third independent light-shielding strip is provided in the third independent exposure region, and penetrates the third independent exposure region in the first direction, and a width of the third independent light-shielding strip is equal to the target width;
   the third splicing light-shielding strip is provided in the third splicing exposure region and connected with corresponding third independent light-shielding strip, and penetrates the third splicing exposure region in the first direction, and the fourth splicing light-shielding strip is provided in the fourth splicing exposure region and connected with corresponding first independent light-shielding strip, and penetrates the fourth splicing exposure region in the first direction;
a width of one of the fourth splicing light-shielding strip and corresponding third splicing light-shielding strip is equal to the target width, a width of the other one is equal to a second auxiliary width, and the second auxiliary width is greater than the target width, a pattern of the fourth splicing light-shielding strip is used for, after being translated along the second vector, forming a second auxiliary splicing pattern, and the second auxiliary splicing pattern is located within corresponding third splicing light-shielding strip, or the second auxiliary splicing pattern covers the corresponding third splicing light-shielding strip;
the fourth splicing exposure region is used for, after being translated along a third vector, forming a third splicing auxiliary region, and the third splicing auxiliary region coincides with the first splicing exposure region;
a pattern of the fourth splicing light-shielding strip, is used for, after being translated along the third vector, forming a third auxiliary splicing pattern, the first splicing light-shielding strip is provided with at least a sacrificial light-shielding segment along an extending direction of the first splicing light-shielding strip, and the sacrificial light-shielding segment is completely non-overlapped with the third auxiliary splicing pattern; and
a plurality of light-shielding strip groups are formed by the plurality of the light-shielding strips, any one of the light-shielding strip groups comprises a previous light-shielding strip and a latter light-shielding strip adjacently disposed, and in any one of the light-shielding strip groups:
one end of the second independent light-shielding strip of the previous light-shielding strip close to the second splicing exposure region is bent towards a direction away from the latter light-shielding strip, one end of the third independent light-shielding strip of the previous light-shielding strip close to the third splicing exposure region is bent towards the direction away from the latter light-shielding strip, one end of the second independent light-shielding strip of the latter light-shielding strip close to the second splicing exposure region is bent towards a direction away from the previous light-shielding strip, and one end of the third independent light-shielding strip of the latter light-shielding strip close to the third splicing exposure region is bent towards the direction away from the previous light-shielding strip;
along a direction away from the first independent exposure region, the first splicing light-shielding strip of the previous light-shielding strip extends towards the direction away from the latter light-shielding strip, the first splicing light-shielding strip of the latter light-shielding strip extends towards the direction away from the previous light-shielding strip, the fourth splicing light-shielding strip of the previous light-shielding strip extends towards the direction away from the latter light-shielding strip, and the fourth splicing light-shielding strip of the latter light-shielding strip extends towards the direction away from the previous light-shielding strip;
along a direction away from the second independent exposure region, the second splicing light-shielding strip of the previous light-shielding strip extends towards a direction close to the latter light-shielding strip, and the second splicing light-shielding strip of the latter light-shielding strip extends towards a direction close to the previous light-shielding strip; and
along a direction away from the third independent exposure region, the third splicing light-shielding strip of the previous light-shielding strip extends towards the direction close to the latter light-shielding strip, and the third splicing light-shielding strip of the latter light-shielding strip extends towards the direction close to the previous light-shielding strip.

2. The mask according to claim 1, wherein the first auxiliary width is equal to 1.2 to 2 times the target width.

3. The mask according to claim 1, wherein the second auxiliary width is equal to 1.2 to 2 times the target width.

4. The mask according to claim 1, wherein;
the fourth splicing exposure region is used for, after being translated along a third vector, forming a third splicing auxiliary region, and the third splicing auxiliary region coincides with the first splicing exposure region; and
a width of one of the first splicing light-shielding strip and corresponding fourth splicing light-shielding strip is equal to the target width, the fourth splicing light-shielding strip is used for, after being translated along the third vector, forming a third auxiliary splicing pattern, and the third auxiliary splicing pattern is located within corresponding first splicing light-shielding strip, or the third auxiliary splicing pattern covers the corresponding first splicing light-shielding strip.

5. The mask according to claim 1, wherein:
a plurality of light-shielding strip groups are formed by the plurality of the light-shielding strips, and any one of the light-shielding strip groups comprises a previous light-shielding strip and a latter light-shielding strip adjacently disposed; and
in one of the light-shielding strip groups, one end of the first independent light-shielding strip of the previous light-shielding strip close to the first splicing exposure region is bent towards a direction away from the latter light-shielding strip, one end of the second independent light-shielding strip of the previous light-shielding strip close to the second splicing exposure region is bent towards the direction away from the latter light-shielding strip, one end of the first independent light-shielding strip of the latter light-shielding strip close to the fourth splicing exposure region is bent towards a direction away from the previous light-shielding strip, and one end of the third independent light-shielding strip of the latter light-shielding strip close to the third splicing exposure region is bent towards the direction away from the previous light-shielding strip.

6. The mask according to claim 1, wherein a size of the first splicing exposure region along the first direction is equal to 1.5 to 8 times the target width.

7. A method, comprising:
providing a mask, the mask comprising:
a first graphic region and a second graphic region disposed along a first direction, and a third graphic region, wherein the first graphic region comprises a first splicing exposure region, the second graphic region comprises a second splicing exposure region, the first splicing exposure region is used for, after being translated along a first vector, forming a first splicing auxiliary region, and the first splicing auxiliary region coincides with the second splicing exposure region;
a plurality of light-shielding strips arranged along a second direction, the second direction being perpendicular to the first direction, wherein any one of the light-shielding strips comprises a first splicing light-shielding strip and a second splicing light-shielding strip correspondingly disposed, the first splicing light-shielding strip is provided in the first splicing exposure region, and penetrates the first splicing exposure region in the first direction, and the second splicing light-shielding strip is provided in the second splicing exposure region, and penetrates the second splicing exposure region in the first direction; and a width of one of the first splicing light-shielding strip and corresponding second splicing light-shielding strip is equal to a target width, a width of the other one is equal to a first auxiliary width, and the first auxiliary width is greater than the target width, a pattern of the first splicing light-shielding strip is used for, after being translated along the first vector, forming a first auxiliary splicing pattern, and the first auxiliary splicing pattern is located within the corresponding second splicing light-shielding strip, or the first auxiliary splicing pattern covers the corresponding second splicing light-shielding strip, wherein:

the first graphic region further comprises a first independent exposure region, the first independent exposure region is disposed adjacent to the first splicing exposure region along the first direction, the second graphic region further comprises a second independent exposure region, the second independent exposure region is disposed adjacent to the second splicing exposure region along the first direction, and the first independent exposure region is used for, after being translated along the first vector, forming a first independent auxiliary region, and the first independent auxiliary region and the second independent exposure region are located on both sides of the second splicing exposure region, respectively;

any one of the light-shielding strips further comprises a first independent light-shielding strip disposed corresponding to the first splicing light-shielding strip and a second independent light-shielding strip disposed corresponding to the second splicing light-shielding strip, the first independent light-shielding strip is provided in the first independent exposure region and connected with corresponding first splicing light-shielding strip, and penetrates the first independent exposure region in the first direction, and the second independent light-shielding strip is provided in the second independent exposure region and connected with corresponding second splicing light-shielding strip, and penetrates the second independent exposure region in the first direction;

widths of the first independent light-shielding strip and the second independent light-shielding strip are both equal to the target width;

the third graphic region comprises a third independent exposure region and a third splicing exposure region adjacently disposed along the first direction, the first graphic region further comprises a fourth splicing exposure region, and the fourth splicing exposure region and the first splicing exposure region are disposed on both sides of the first independent exposure region, respectively;

the fourth splicing exposure region is used for, after being translated along a second vector, forming a second splicing auxiliary region, and the second splicing auxiliary region coincides with the third splicing exposure region, and the first independent exposure region is used for, after being translated along the second vector, forming a second independent auxiliary region, and the second independent auxiliary region and the third independent exposure region are located on both sides of the third splicing exposure region, respectively;

the light-shielding strips further comprise a third splicing light-shielding strip disposed corresponding to the first splicing light-shielding strip, a fourth splicing light-shielding strip disposed corresponding to the second splicing light-shielding strip, and a third independent light-shielding strip disposed corresponding to the first independent light-shielding strip and the second independent light-shielding strip, the third independent light-shielding strip is provided in the third independent exposure region, and penetrates the third independent exposure region in the first direction, and a width of the third independent light-shielding strip is equal to the target width;

the third splicing light-shielding strip is provided in the third splicing exposure region and connected with corresponding third independent light-shielding strip, and penetrates the third splicing exposure region in the first direction, and the fourth splicing light-shielding strip is provided in the fourth splicing exposure region and connected with corresponding first independent light-shielding strip, and penetrates the fourth splicing exposure region in the first direction;

a width of one of the fourth splicing light-shielding strip and corresponding third splicing light-shielding strip is equal to the target width, a width of the other one is equal to a second auxiliary width, and the second auxiliary width is greater than the target width, a pattern of the fourth splicing light-shielding strip is used for, after being translated along the second vector, forming a second auxiliary splicing pattern, and the second auxiliary splicing pattern is located within corresponding third splicing light-shielding strip, or the second auxiliary splicing pattern covers the corresponding third splicing light-shielding strip;

the fourth splicing exposure region is used for, after being translated along a third vector, forming a third splicing auxiliary region, and the third splicing auxiliary region coincides with the first splicing exposure region;

a pattern of the fourth splicing light-shielding strip, is used for, after being translated along the third vector, forming a third auxiliary splicing pattern, the first splicing light-shielding strip is provided with at least a sacrificial light-shielding segment along an extending direction of the first splicing light-shielding strip, and the sacrificial light-shielding segment is completely non-overlapped with the third auxiliary splicing pattern; and a plurality of light-shielding strip groups are formed by the plurality of the light-shielding strips, any one of the light-shielding strip groups comprises a previous light-shielding strip and a latter light-shielding strip adjacently disposed, and in any one of the light-shielding strip groups:

one end of the second independent light-shielding strip of the previous light-shielding strip close to the second splicing exposure region is bent towards a direction away from the latter light-shielding strip, one end of the third independent light-shielding strip of the previous light-shielding strip close to the third splicing exposure region is bent towards the direction away from the latter light-shielding strip, one end of the second independent light-shielding strip of the latter light-shielding strip close to the second splicing exposure region is bent towards a direction away from the previous light-shielding strip, and one end of the third independent light-shielding strip of the latter light-shielding strip close to the third splicing exposure region is bent towards the direction away from the previous light-shielding strip;

along a direction away from the first independent exposure region, the first splicing light-shielding strip of the previous light-shielding strip extends towards the direction away from the latter light-shielding strip, the first splicing light-shielding strip of the latter light-shielding strip extends towards the direction away from the previous light-shielding strip, the fourth splicing light-shielding strip of the previous light-shielding strip extends towards the direction away from the latter light-shielding strip, and the fourth splicing light-shielding strip of the latter light-shielding strip extends towards the direction away from the previous light-shielding strip;

along a direction away from the second independent exposure region, the second splicing light-shielding strip of the previous light-shielding strip extends towards a direction close to the latter light-shielding strip, and the second splicing light-shielding strip of the latter light-shielding strip extends towards a direction close to the previous light-shielding strip; and along a direction away from the third independent exposure region, the third splicing light-shielding strip of the previous light-shielding strip extends towards the direction close to the latter light-shielding strip, and the third splicing light-shielding strip of the latter light-shielding strip extends towards the direction close to the previous light-shielding strip.

8. The method according to claim 7, wherein the first auxiliary width is equal to 1.2 to 2 times the target width.

9. The method according to claim 7, wherein the second auxiliary width is equal to 1.2 to 2 times the target width.

10. The method according to claim 7, wherein:
the fourth splicing exposure region is used for, after being translated along a third vector, forming a third splicing auxiliary region, and the third splicing auxiliary region coincides with the first splicing exposure region; and
a width of one of the first splicing light-shielding strip and corresponding fourth splicing light-shielding strip is equal to the target width, the fourth splicing light-shielding strip is used for, after being translated along the third vector, forming a third auxiliary splicing pattern, and the third auxiliary splicing pattern is located within corresponding first splicing light-shielding strip, or the third auxiliary splicing pattern covers the corresponding first splicing light-shielding strip.

11. The method according to claim 7, wherein:
a plurality of light-shielding strip groups are formed by the plurality of the light-shielding strips, and any one of the light-shielding strip groups comprises a previous light-shielding strip and a latter light-shielding strip adjacently disposed; and
in one of the light-shielding strip groups, one end of the first independent light-shielding strip of the previous light-shielding strip close to the first splicing exposure region is bent towards a direction away from the latter light-shielding strip, one end of the second independent light-shielding strip of the previous light-shielding strip close to the second splicing exposure region is bent towards the direction away from the latter light-shielding strip, one end of the first independent light-shielding strip of the latter light-shielding strip close to the fourth splicing exposure region is bent towards a direction away from the previous light-shielding strip, and one end of the third independent light-shielding strip of the latter light-shielding strip close to the third splicing exposure region is bent towards the direction away from the previous light-shielding strip.

12. The method according to claim 7, wherein a size of the first splicing exposure region along the first direction is equal to 1.5 to 8 times the target width.

* * * * *

UNITED STATES PATENT AND TRADEMARK OFFICE
CERTIFICATE OF CORRECTION

| | |
|---|---|
| PATENT NO. | : 12,169,356 B2 |
| APPLICATION NO. | : 17/639071 |
| DATED | : December 17, 2024 |
| INVENTOR(S) | : Jiabin Zou et al. |

Page 1 of 1

It is certified that error appears in the above-identified patent and that said Letters Patent is hereby corrected as shown below:

On the Title Page

Item (12), please delete:
"Zou, Sr."
And replace with:
"Zou"

Item (72), Column 1, Lines 8-11, in the Inventors section, please delete:
"Jiabin Zou, Sr., Beijing(CN); Xiaofeng Yin, Beijing(CN); Chunguang Tian, Beijing(CN); Na Wen, Beijing(CN)"
And replace with:
"Jiabin Zou, Beijing(CN); Xiaofeng Yin, Beijing(CN); Chunguang Tian, Beijing(CN); Na Wen, Beijing(CN)"

Signed and Sealed this
Thirteenth Day of May, 2025

Coke Morgan Stewart
*Acting Director of the United States Patent and Trademark Office*